(12) United States Patent
Huang et al.

(10) Patent No.: US 12,389,665 B2
(45) Date of Patent: Aug. 12, 2025

(54) SEMICONDUCTOR DEVICE STRUCTURE

(71) Applicant: Taiwan Semiconductor Manufacturing Company, Ltd., Hsinchu (TW)

(72) Inventors: Lin-Yu Huang, Hsinchu (TW); Sheng-Tsung Wang, Hsinchu (TW); Jia-Chuan You, Taoyuan (TW); Chia-Hao Chang, Hsinchu (TW); Tien-Lu Lin, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/410,016

(22) Filed: Jan. 11, 2024

(65) Prior Publication Data
US 2024/0178069 A1 May 30, 2024

Related U.S. Application Data

(60) Continuation of application No. 17/818,443, filed on Aug. 9, 2022, now Pat. No. 11,908,744, which is a
(Continued)

(51) Int. Cl.
*H10D 84/03* (2025.01)
*H01L 21/02* (2006.01)
(Continued)

(52) U.S. Cl.
CPC ...... *H10D 84/038* (2025.01); *H01L 21/02532* (2013.01); *H01L 21/32134* (2013.01); *H01L 21/32139* (2013.01); *H10D 30/6219* (2025.01); *H10D 30/797* (2025.01); *H10D 62/021* (2025.01); *H10D 62/151* (2025.01); *H10D 64/01* (2025.01); *H10D 64/015* (2025.01);
(Continued)

(58) Field of Classification Search
CPC ............ H01L 29/6653; H01L 29/6656; H01L 21/76834; H01L 21/76885; H01L 21/76897; H01L 21/823475; H01L 21/823871; H01L 21/76804; H10D 30/6219; H10D 84/0149; H10D 84/0186
See application file for complete search history.

(56) References Cited

U.S. PATENT DOCUMENTS 6,001,726 A 12/1999 Nagabushnam et al.
8,772,109 B2 7/2014 Colinge
(Continued)

*Primary Examiner* — Sonya McCall-Shepard
(74) *Attorney, Agent, or Firm* — McClure, Qualey & Rodack, LLP

(57) ABSTRACT

Semiconductor device structures and method for forming the same are provided. The semiconductor device structure includes a substrate and a gate stack formed over the substrate. The semiconductor device structure further includes a source/drain structure formed adjacent to the gate stack and a contact structure vertically overlapping the source/drain structure. In addition, the contact structure has a first sidewall slopes downwardly from its top surface to its bottom surface, and an angle between the first sidewall and a bottom surface of the contact structure is smaller than 89.5°.

20 Claims, 44 Drawing Sheets

Related U.S. Application Data continuation of application No. 17/120,689, filed on Dec. 14, 2020, now Pat. No. 11,508,622, which is a division of application No. 16/571,684, filed on Sep. 16, 2019, now Pat. No. 10,867,863.

(51) Int. Cl.

| | | |
|---|---|---|
| *H01L 21/311* | (2006.01) | |
| *H01L 21/3213* | (2006.01) | |
| *H01L 21/768* | (2006.01) | |
| *H10D 30/62* | (2025.01) | |
| *H10D 30/69* | (2025.01) | |
| *H10D 62/00* | (2025.01) | |
| *H10D 62/13* | (2025.01) | |
| *H10D 64/01* | (2025.01) | |
| *H10D 84/01* | (2025.01) | |
| *H10D 84/83* | (2025.01) | |
| *H10D 84/85* | (2025.01) | |

(52) U.S. Cl.
CPC ......... *H10D 64/017* (2025.01); *H10D 64/021* (2025.01); *H10D 84/013* (2025.01); *H10D 84/0135* (2025.01); *H10D 84/0158* (2025.01); *H10D 84/834* (2025.01); *H01L 21/02164* (2013.01); *H01L 21/31116* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,243,053 B1 * | 3/2019 | Xie ................... H01L 29/785 |
| 10,374,040 B1 | 8/2019 | Chanemougame et al. |
| 2017/0125543 A1 | 5/2017 | Greene et al. |
| 2019/0164960 A1 | 5/2019 | Chen et al. |
| 2020/0111713 A1 | 4/2020 | Zang et al. |

* cited by examiner

SEMICONDUCTOR DEVICE STRUCTURE

PRIORITY CLAIM AND CROSS-REFERENCE

This Application is a continuation application of U.S. application Ser. No. 17/818,443, filed on Aug. 9, 2022 (now U.S. Pat. No. 11,908,744), which is a continuation application of U.S. application Ser. No. 17/120,689, filed on Dec. 14, 2020 (now U.S. Pat. No. 11,508,622), which is a divisional application of U.S. application Ser. No. 16/571,684, filed on Sep. 16, 2019, now U.S. Pat. No. 10,867,863, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1A-2 is a top view of the semiconductor device structure of FIG. 1A, in accordance with some embodiments.

FIG. 1A-3 is a cross-sectional view illustrating the semiconductor device structure along a sectional line II-II' in FIG. 1A-2, in accordance with some embodiments.

FIG. 1H-1 is a top view of the semiconductor device structure of FIG. 1H, in accordance with some embodiments.

FIG. 1H-2 is a cross-sectional view illustrating the semiconductor device structure along a sectional line II-II' in FIG. 1H-1, in accordance with some embodiments.

FIG. 2A-1 to FIG. 2I-1 are cross-sectional views illustrating the semiconductor device structure along a sectional line I-I' in FIG. 2A to FIG. 2I, in accordance with some embodiments.

FIG. 2A-2 to FIG. 2I-2 are cross-sectional views illustrating the semiconductor device structure along a sectional line II-II' in FIG. 2A to FIG. 2I, in accordance with some embodiments.

FIG. 2I-3 is a cross-sectional view illustrating the semiconductor device structure along a sectional line III-III' in FIG. 2I, in accordance with some embodiments.

FIG. 2I-4 is a cross-sectional view illustrating the semiconductor device structure along a sectional line IV-IV' in FIG. 2I, in accordance with some embodiments.

FIG. 2I-5 is a perspective view of the semiconductor device structure of FIG. 2I, in accordance with some embodiments.

FIG. 3 is a cross-sectional view illustrating a semiconductor device structure, in accordance with some embodiments.

DETAILED DESCRIPTION

Figure 1A:
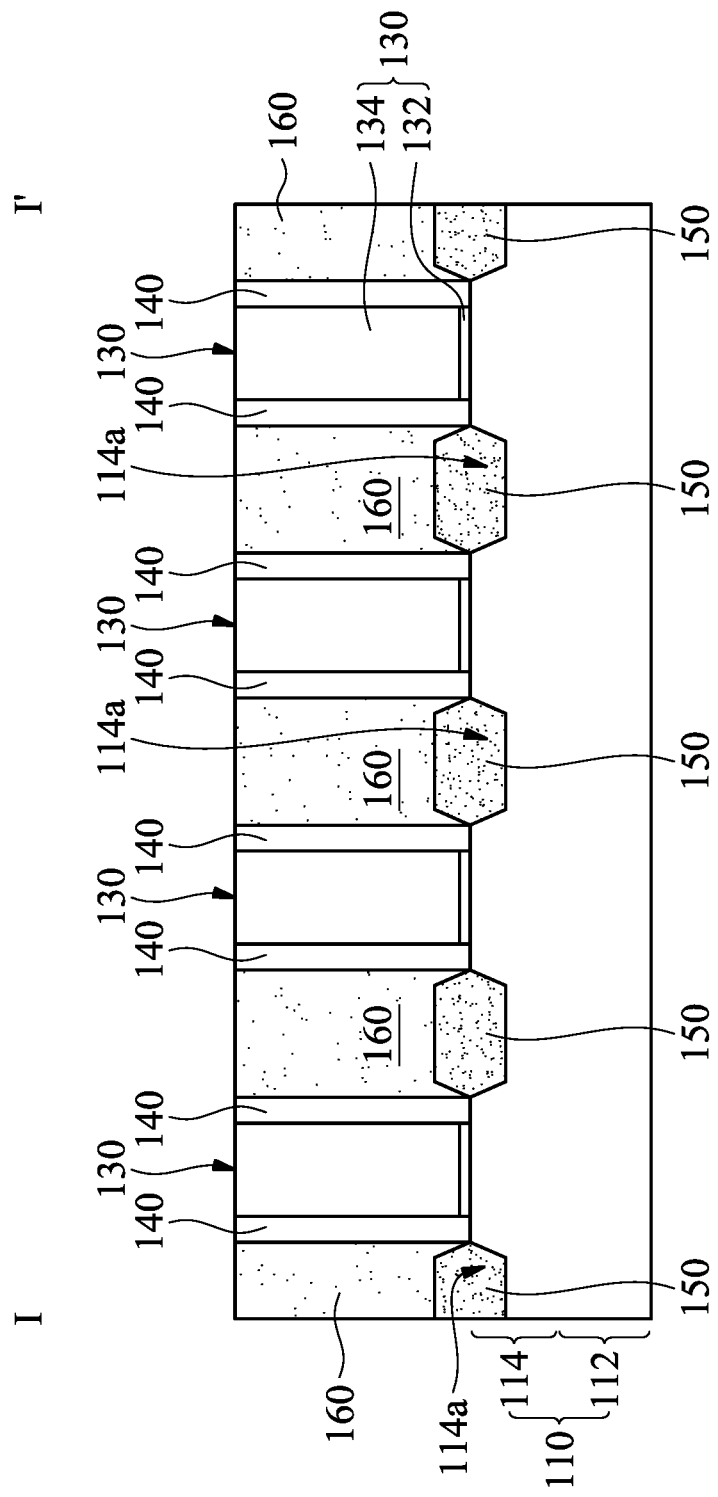
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 1, 1A:
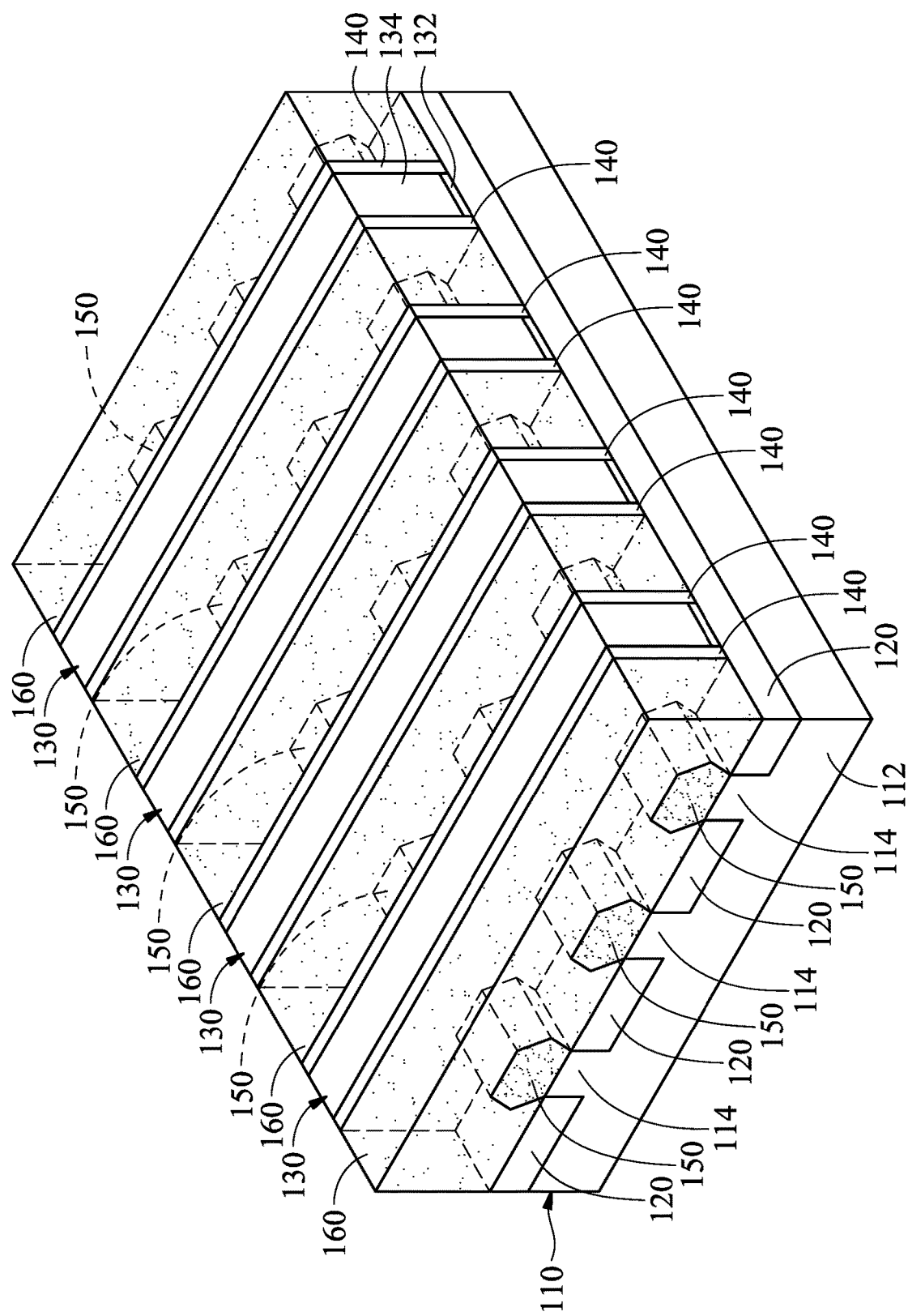
Figures 1, 1A, 2:
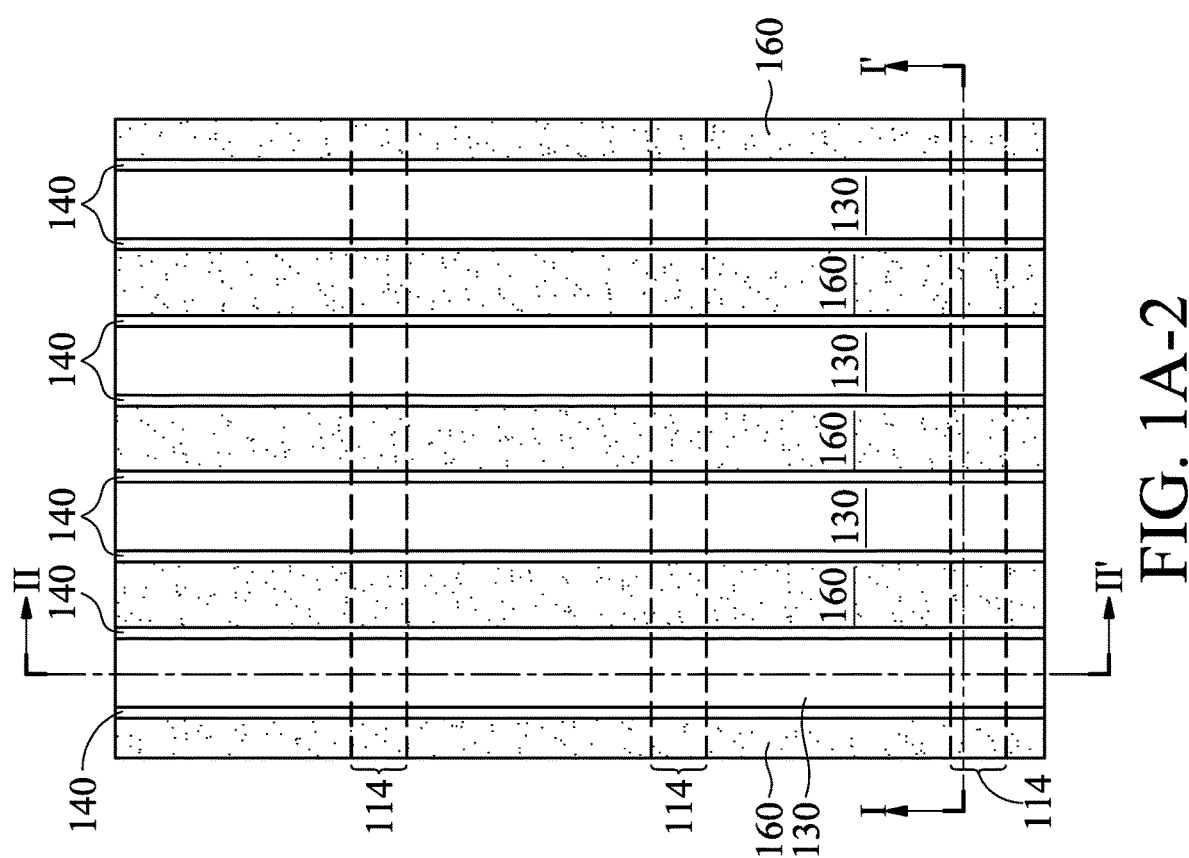

FIGS. 1A-1H are cross-sectional views of various stages of a process for forming a semiconductor device structure, in accordance with some embodiments. FIG. 1A-1 is a perspective view of the semiconductor device structure of FIG. 1A, in accordance with some embodiments. FIG. 1A-2 is a top view of the semiconductor device structure of FIG. 1A, in accordance with some embodiments. FIG. 1A is a cross-sectional view illustrating the semiconductor device structure along a sectional line I-I' in FIG. 1A-2, in accordance with some embodiments. FIG. 1A-3 is a cross-sectional view illustrating the semiconductor device structure along a sectional line II-II' in FIG. 1A-2, in accordance with some embodiments.

As shown in FIGS. 1A and 1A-1, a substrate 110 is provided, in accordance with some embodiments. The substrate 110 has a base structure 112 and fin structures 114, in accordance with some embodiments. The fin structures 114 are over the base structure 112, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon (e.g., undoped silicon and/or doped silicon) or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

As shown in FIGS. 1A-1 and 1A-3, an isolation layer 120 is formed over the base structure 112, in accordance with some embodiments. The isolation layer 120 is between the fin structures 114, in accordance with some embodiments. The isolation layer 120 is made of an insulating material, such as oxide (e.g., silicon oxide), fluorosilicate glass (FSG), a low-k dielectric material, and/or another suitable insulating material. The isolation layer 120 may be deposited by an atomic layer deposition (ALD) process, a chemical vapor deposition (CVD) process, or another applicable process.

As shown in FIGS. 1A, 1A-1, 1A-2, and 1A-3, gate structures 130 are formed over the fin structures 114 and the isolation layer 120, in accordance with some embodiments. The gate structures 130 extend across the fin structures 114, in accordance with some embodiments. The gate structures 130 wrap around upper portions of the fin structures 114, in accordance with some embodiments.

Each gate structure 130 includes a gate dielectric layer 132 and a gate electrode 134, in accordance with some embodiments. The gate electrode 134 is over the gate dielectric layer 132, in accordance with some embodiments. The gate dielectric layer 132 is made of an insulating material, such as an oxide material (e.g., silicon oxide), in accordance with some embodiments. In some other embodiments, the gate dielectric layer 132 is made of, for example, a high dielectric constant (high-k) material.

The high-k material includes transition metal-oxides, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, or a combination thereof.

In some other embodiments, the high-k material includes metal oxides (e.g., aluminum oxide), metal nitrides, metal silicates, transition metal-nitrides, transition metal-silicates, oxynitride of metals, or a combination thereof. The gate electrode 134 is made of a conductive material, such as a semiconductor material (e.g., polysilicon), in accordance with some embodiments.

As shown in FIGS. 1A and 1A-1, spacers 140 are formed over sidewalls of the gate structures 130, in accordance with some embodiments. The spacers 140 are single-layered structures or multi-layered structures, in accordance with some embodiments. The spacers 140 are made of an insulating material, such as silicon nitride, silicon oxide, silicon carbide, silicon oxynitride, or another applicable insulating material.

As shown in FIG. 1A, the fin structures 114, which are not covered by the gate structures 130 and the spacers 140, are partially removed to form recesses 114a in the fin structures 114, in accordance with some embodiments. The recesses 114a are between or adjacent to the gate structures 130, in accordance with some embodiments. The recesses 114a are formed using an etching process, in accordance with some embodiments. The etching process uses the gate structures 130 and the spacers 140 as an etching mask, in accordance with some embodiments.

As shown in FIGS. 1A and 1A-1, stressors 150 are formed in the recesses 114a, in accordance with some embodiments. The stressors 150 protrude out of the recesses 114a, in accordance with some embodiments. The stressors 150 are in direct contact with the fin structures 114, in accordance with some embodiments. The stressors 150 are positioned on two opposite sides of the corresponding gate structure 130, in accordance with some embodiments.

In some embodiments, the stressors 150 on two opposite sides of each gate structure 130 include a source structure and a drain structure. In some embodiments, the stressors 150 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 150 are made of a semiconductor material (e.g., silicon germanium) with P-type dopants, such as the Group IIIA element, in accordance with some embodiments. The Group IIIA element includes boron or another suitable material. The stressors 150 are formed using an epitaxial process, in accordance with some embodiments.

As shown in FIGS. 1A and 1A-1, a dielectric layer 160 is formed over the stressors 150 and the isolation layer 120, in accordance with some embodiments. The dielectric layer 160 is made of an insulating material, such as oxides, e.g., silicon oxide ($SiO_2$), in accordance with some embodiments.

Figures 1, 1A, 2, 3:
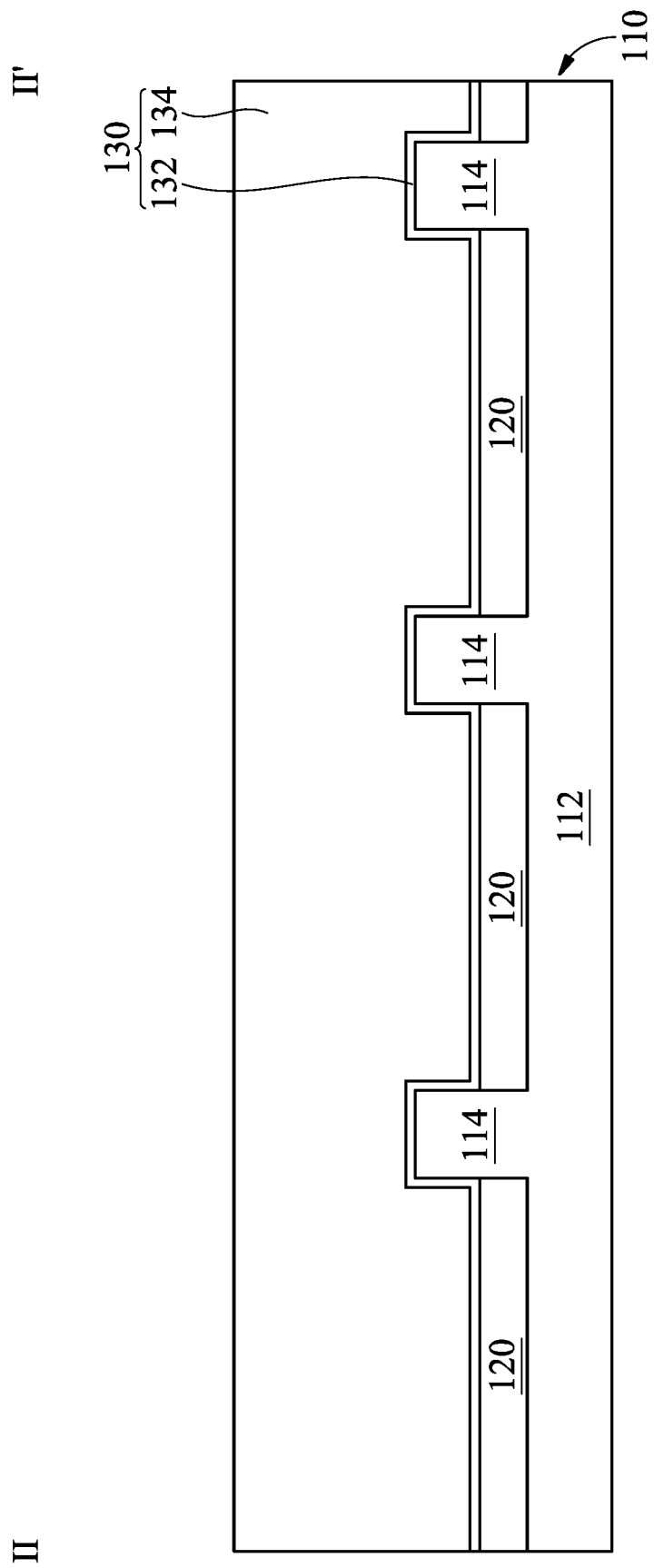
Figure 1B:
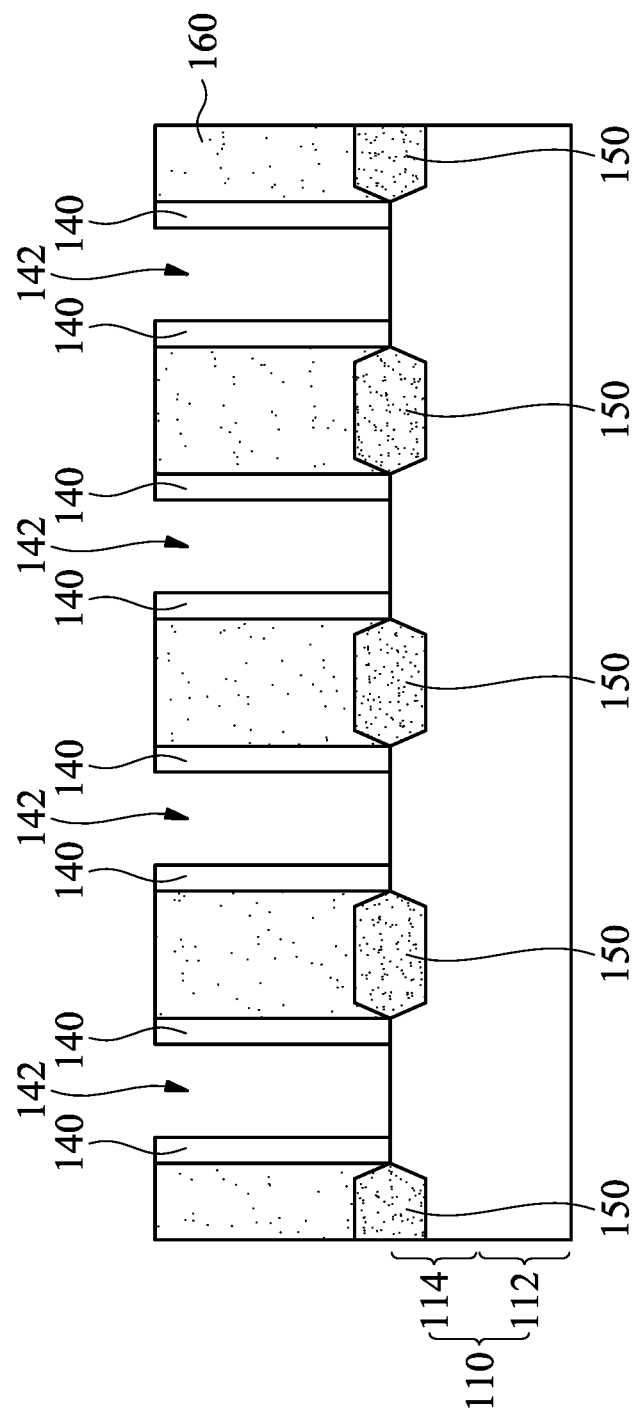

As shown in FIG. 1B, the gate structures 130 are removed, in accordance with some embodiments. The removal process includes a wet etching process, in accordance with some embodiments. After the removal process, trenches 142 are formed between the spacers 140, in accordance with some embodiments. The trenches 142 expose portions of the fin structures 114, in accordance with some embodiments.

Figure 1C:
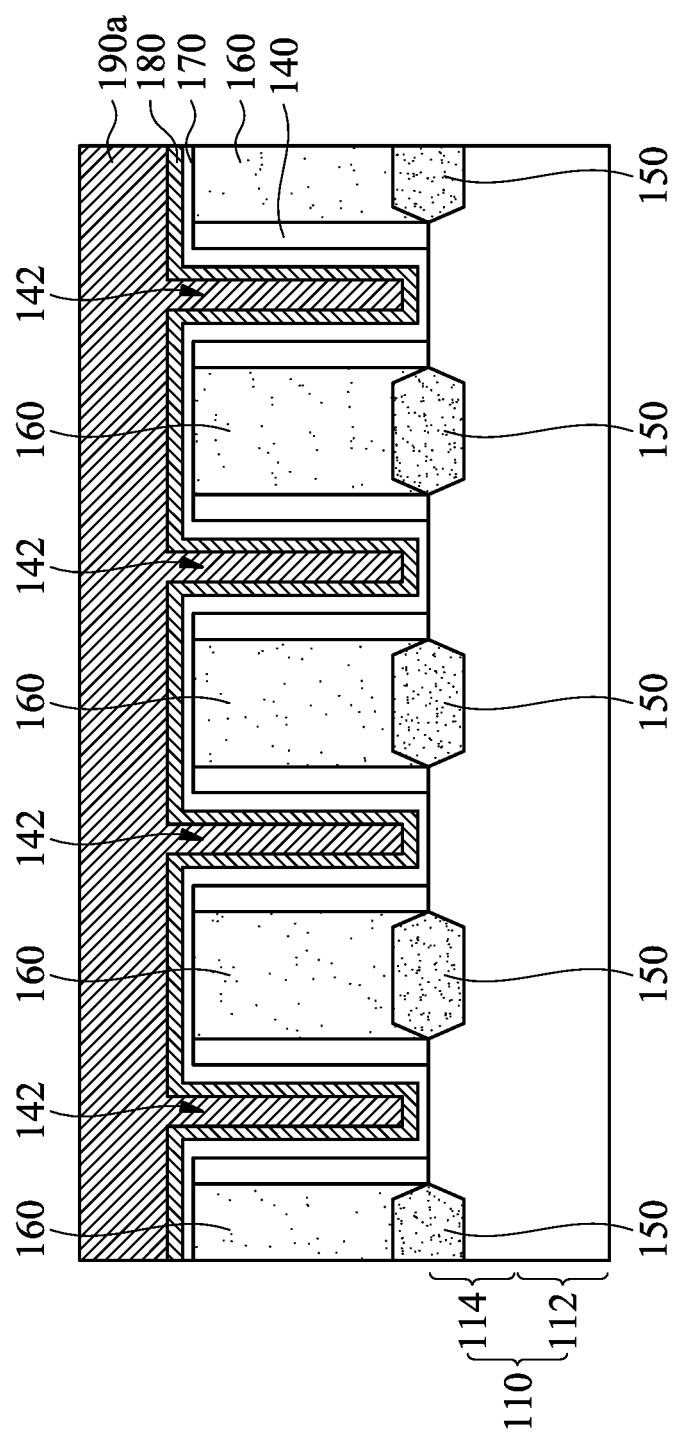

As shown in FIG. 1C, a gate dielectric layer 170 is formed in the trenches 142 and over the fin structures 114 exposed by the trenches 142, in accordance with some embodiments. The gate dielectric layer 170 conformally covers the spacers 140, the dielectric layer 160, and the fin structures 114, in accordance with some embodiments. In some embodiments, a dielectric constant of the gate dielectric layer 170 is greater than a dielectric constant of silicon dioxide. The gate dielectric layer 170 is made of a high-k dielectric material, in accordance with some embodiments.

The high-k material includes transition metal-oxides, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium dioxide-alumina ($HfO_2$—$Al_2O_3$) alloy, or a combination thereof, in accordance with some embodiments. In some other embodiments, the high-k material includes metal oxides (e.g., aluminum oxide), metal nitrides, metal silicates, transition metal-nitrides, transition metal-silicates, oxynitride of metals, or a combination thereof.

The formation of the gate dielectric layer 170 includes conformally depositing the gate dielectric layer 170 over the spacers 140, the dielectric layer 160, and the fin structures 114, in accordance with some embodiments. The deposition process includes a chemical vapor deposition process, an atomic layer deposition (ALD) process, or a physical vapor deposition process, in accordance with some embodiments.

In some other embodiments (not shown), an interfacial layer is formed over the fin structures 114 before the formation of the gate dielectric layer 170 to improve the adhesion between the gate dielectric layer 170 and the fin structures 114. The interfacial layer is made of an oxide-containing material such as silicon oxide, in accordance with some embodiments.

Thereafter, as shown in FIG. 1C, a work function metal layer 180 is formed over the gate dielectric layer 170, in accordance with some embodiments. The work function metal layer 180 provides a desired work function for a transistor to enhance device performance including improved threshold voltage.

In the embodiments of forming a PMOS transistor, the work function metal layer 180 is used to provide a work function value suitable for the device, such as equal to or greater than about 4.8 eV. The work function metal layer 180 may be made of metal, metal carbide, metal nitride, other suitable materials, or a combination thereof. For example, the work function metal layer 180 is made of titanium, titanium nitride, other suitable materials, or a combination thereof.

In the embodiments of forming an NMOS transistor, the work function metal layer 180 is used to provide a work function value suitable for the device, such as equal to or less than about 4.5 eV. The work function metal layer 180 may be made of metal, metal carbide, metal nitride, or a combination thereof. For example, the work function metal layer 180 is made of tantalum, tantalum nitride, or a combination thereof.

The work function metal layer 180 is formed using a deposition process, in accordance with some embodiments. The deposition process includes an atomic layer deposition (ALD), a chemical vapor deposition (CVD) process, another suitable method, or a combination thereof.

Afterwards, as shown in FIG. 1C, a gate electrode layer 190a is formed in the trenches 142 and over the work function metal layer 180, in accordance with some embodiments. The gate electrode layer 190a is made of a suitable conductive material, such as metal (e.g., aluminum, tungsten, gold, platinum, or cobalt), an alloy thereof, or a combination thereof, in accordance with some embodiments. The gate electrode layer 190a is formed using a deposition process such as a physical vapor deposition (PVD) process, a chemical vapor deposition (CVD) process, or an atomic layer deposition (ALD) process, in accordance with some embodiments.

Figure 1D:
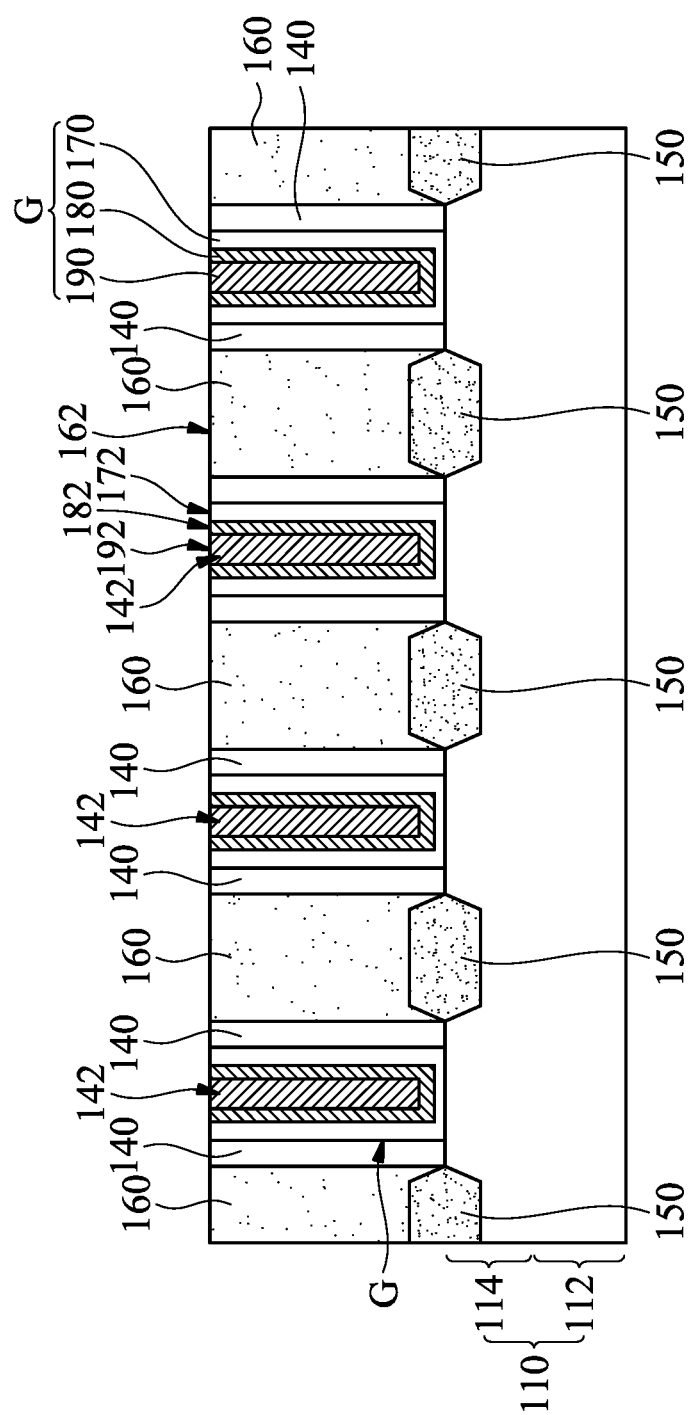

Thereafter, as shown in FIG. 1D, the gate dielectric layer 170, the work function metal layer 180, and the gate electrode layer 190a outside of the trenches 142 are removed, in accordance with some embodiments. The gate electrode layer 190a remaining in the trenches 142 forms gate electrodes 190, in accordance with some embodiments.

The top surfaces 172, 182, 192, and 162 of the gate dielectric layer 170, the work function metal layer 180, the gate electrodes 190, and the dielectric layer 160 are substantially coplanar, in accordance with some embodiments. The term "substantially coplanar" in the application may include small deviations from coplanar geometries. The deviations may be due to manufacturing processes.

The gate dielectric layer 170, the work function metal layer 180, and the gate electrodes 190 in the same trench 142 together form a gate stack G, in accordance with some embodiments. The gate stack G and the stressors 150 (including a source structure and a drain structure) on the opposite sides of the gate stack G together form a transistor, in accordance with some embodiments. The removal process includes a planarization process such as a chemical mechanical polishing (CMP) process, in accordance with some embodiments.

Figure 1E:
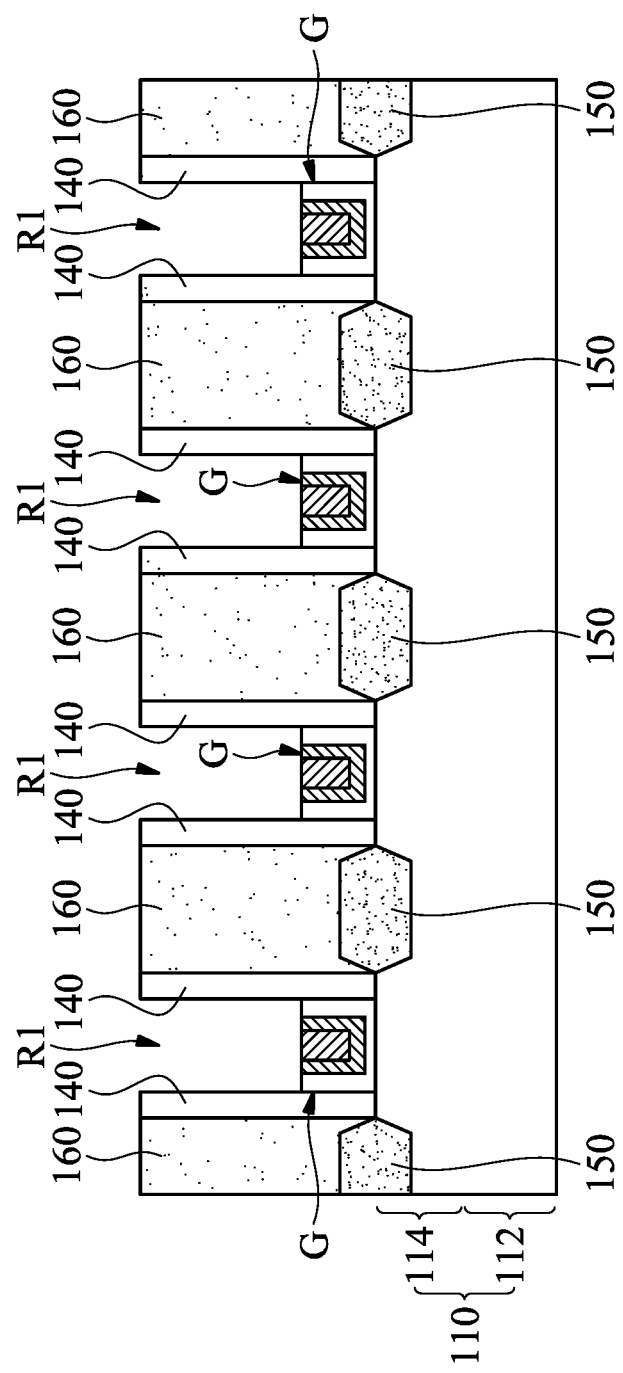

As shown in FIG. 1E, upper portions of the gate stacks G are removed to form recesses R1 over the gate stacks G, in accordance with some embodiments. Each recess R1 is surrounded by the corresponding gate stack G and the dielectric layer 160 (or the spacers 140), in accordance with some embodiments.

Figure 1F:
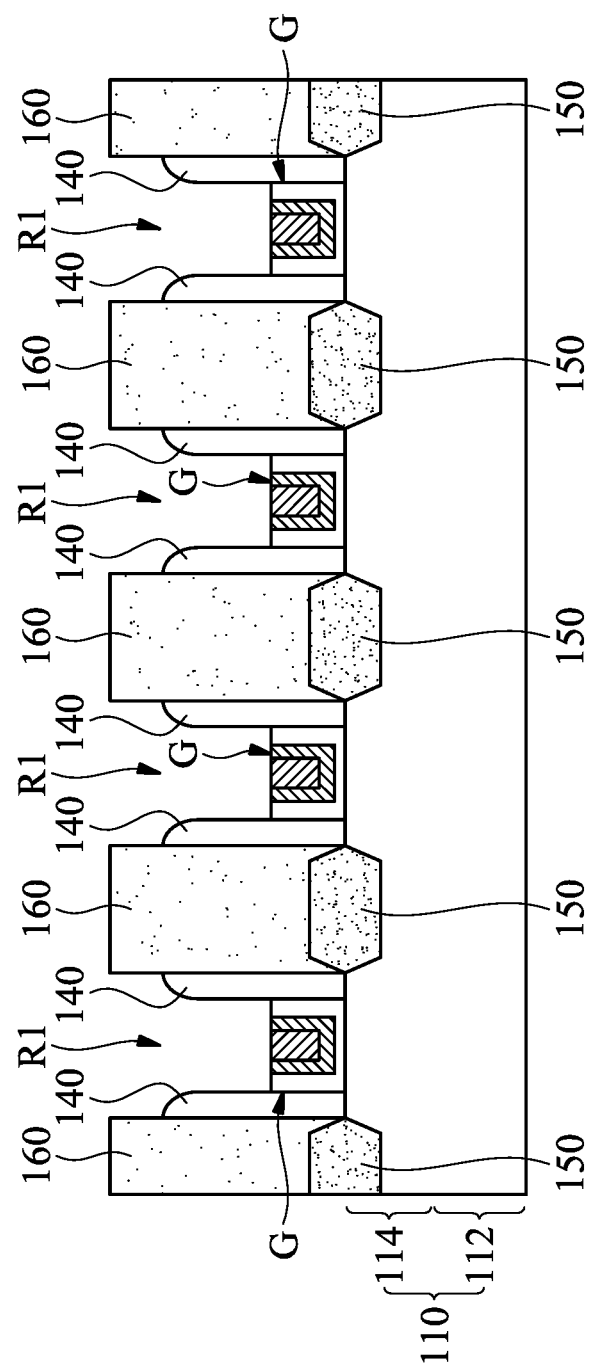

As shown in FIG. 1F, upper portions of the spacers 140 are removed to enlarge the openings of the recesses R1, in accordance with some embodiments. The removal process includes an anisotropic etching process, such as a dry etching process, in accordance with some embodiments.

Figure 1G:
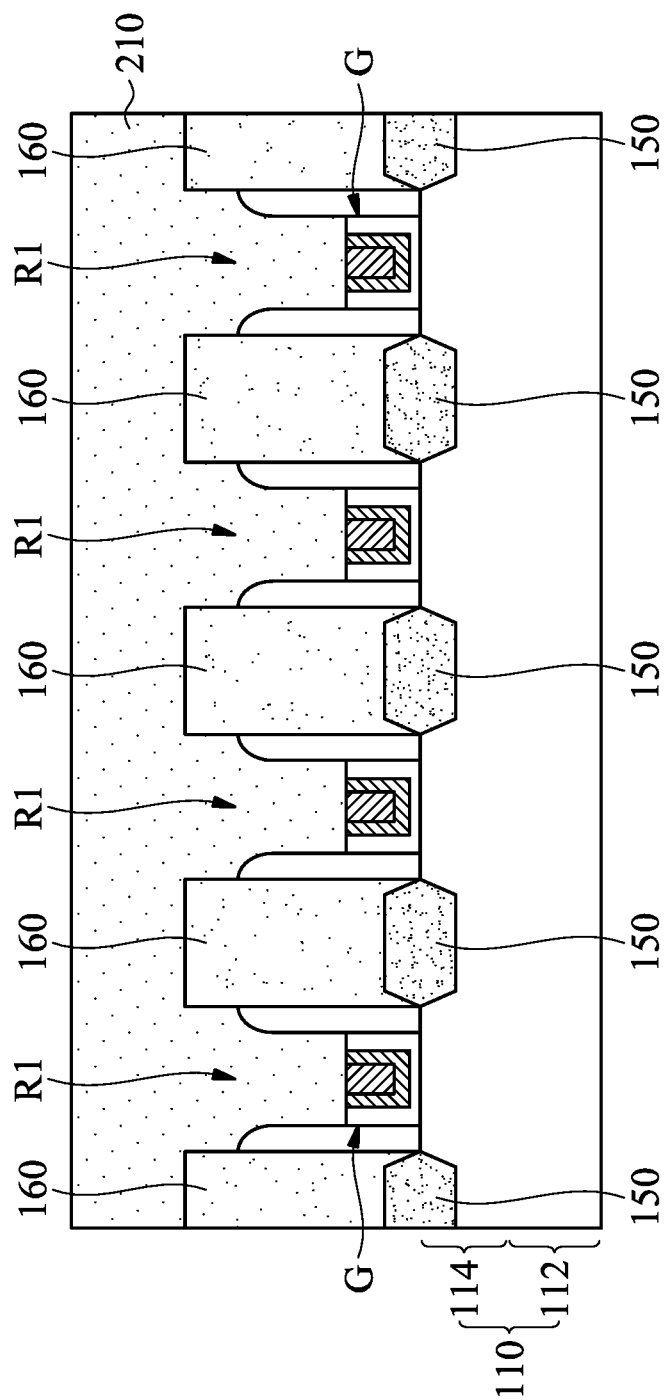

As shown in FIG. 1G, a cap layer 210 is formed in the recesses R1 to cover the gate stacks G, in accordance with some embodiments. The cap layer 210 is made of a nitrogen containing material, such as silicon nitride (SiN), aluminum oxynitride (AlON), zirconium nitride (ZrN), tantalum carbonitride (TaCN), silicon oxycarbonitride (SiOCN), or silicon carbonitride (SiCN), in accordance with some embodiments.

In some other embodiments, the cap layer 210 is made of metal oxides, such as lanthanum oxide (LaO), aluminum oxide (AlO), zirconium oxide (ZrO), hafnium oxide (HfO), zinc oxide (ZnO), zirconium aluminum oxide (ZrAlO), titanium oxide (TiO), tantalum oxide (TaO), or yttrium oxide (YO), in accordance with some embodiments. In some embodiments, the cap layer 210 is made of a silicon containing material, such as silicon carbide (SiC), silicon (Si), zirconium silicide (ZrSi), hafnium silicide (HfSi), silicon oxycarbide (SiOC), or silicon oxide (SiO).

Figure 1H:
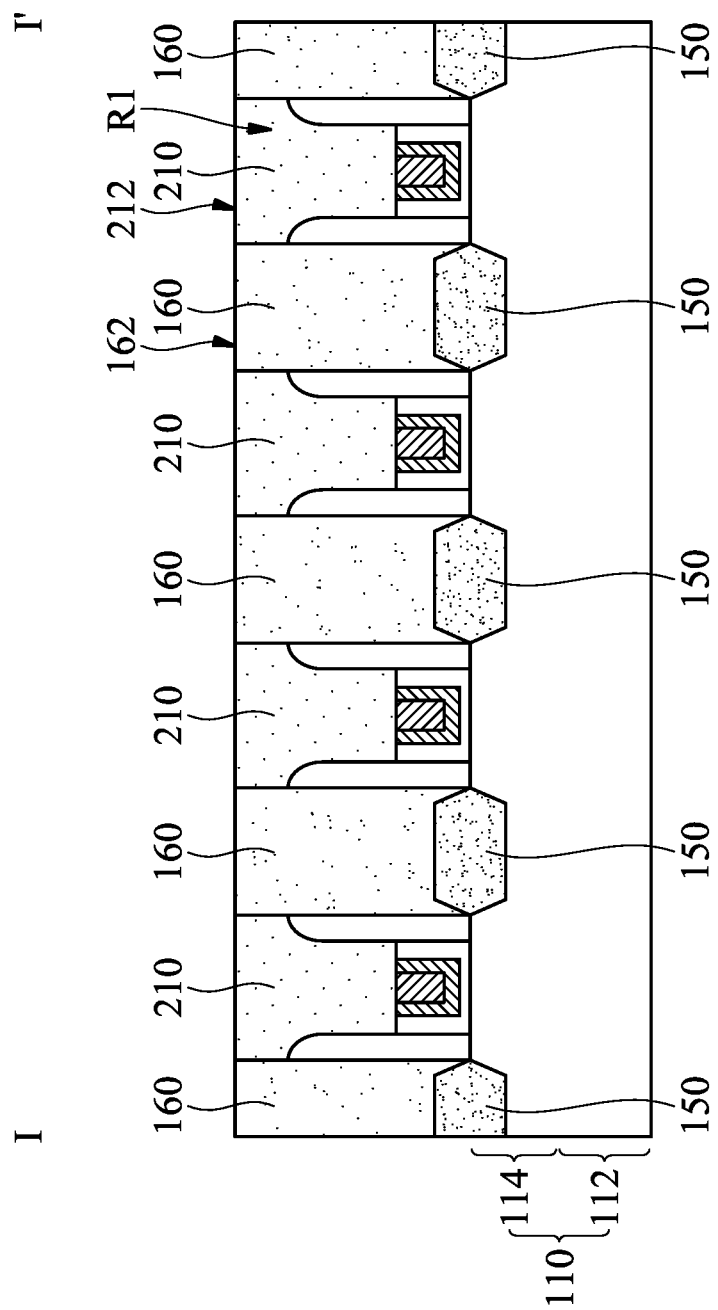
Figures 1, 1H:
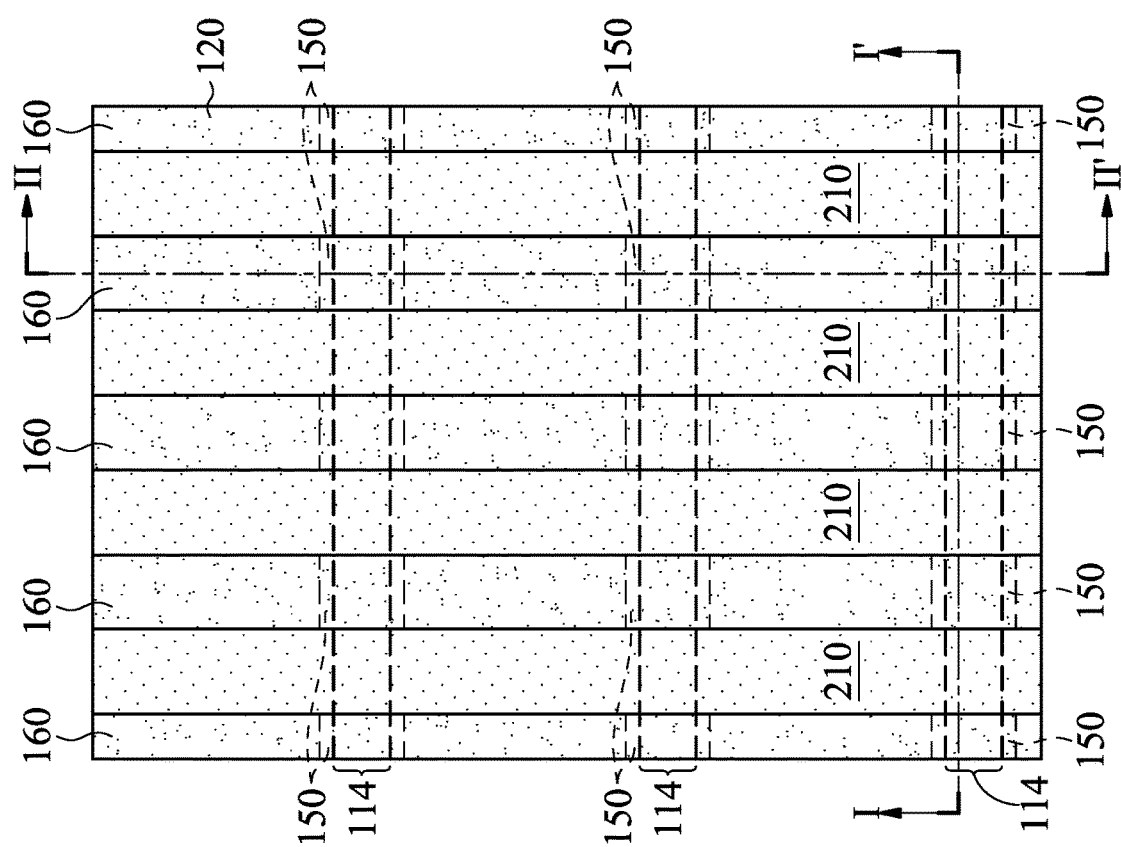
Figures 1, 1H, 2:
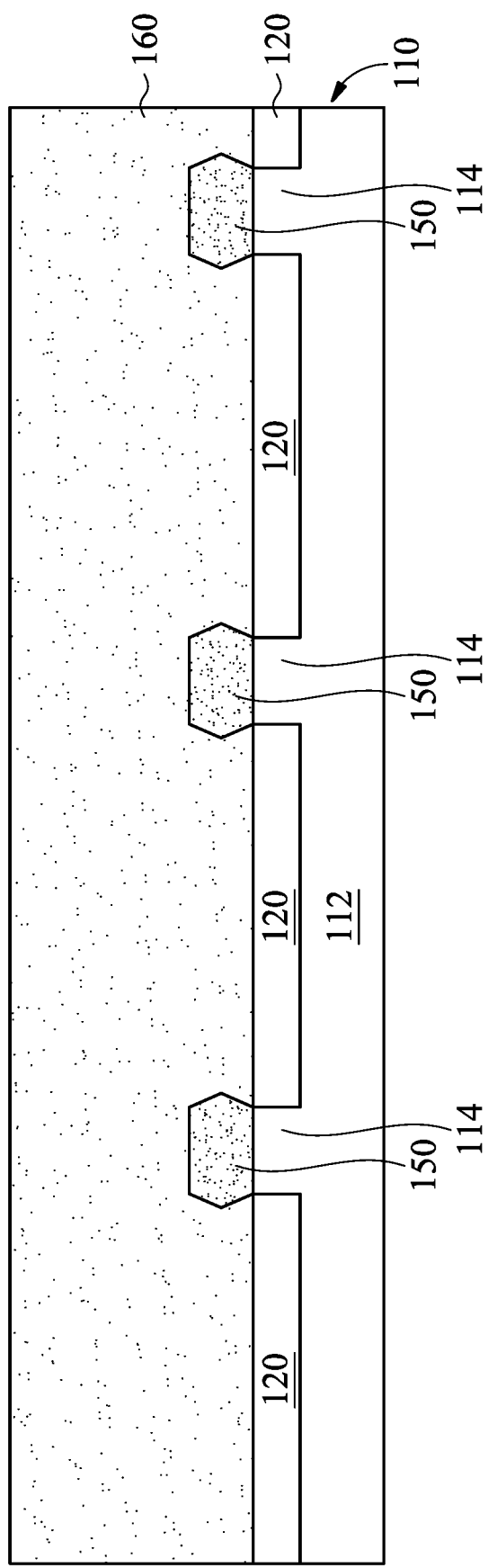

FIG. 1H-1 is a top view of the semiconductor device structure of FIG. 1H, in accordance with some embodiments. FIG. 1H is a cross-sectional view illustrating the semiconductor device structure along a sectional line I-I' in FIG. 1H-1, in accordance with some embodiments. FIG. 1H-2 is a cross-sectional view illustrating the semiconductor device structure along a sectional line II-II' in FIG. 1H-1, in accordance with some embodiments.

As shown in FIGS. 1H, 1H-1, and 1H-2, the cap layer 210 outside of the recesses R1 is removed, in accordance with some embodiments. The removal process includes a chemical mechanical polishing (CMP) process, in accordance with some embodiments. Therefore, a top surface 212 of the cap layer 210 remaining in the recesses R1 and the top surface 162 of the dielectric layer 160 are substantially coplanar, in accordance with some embodiments.

Figure 2A:
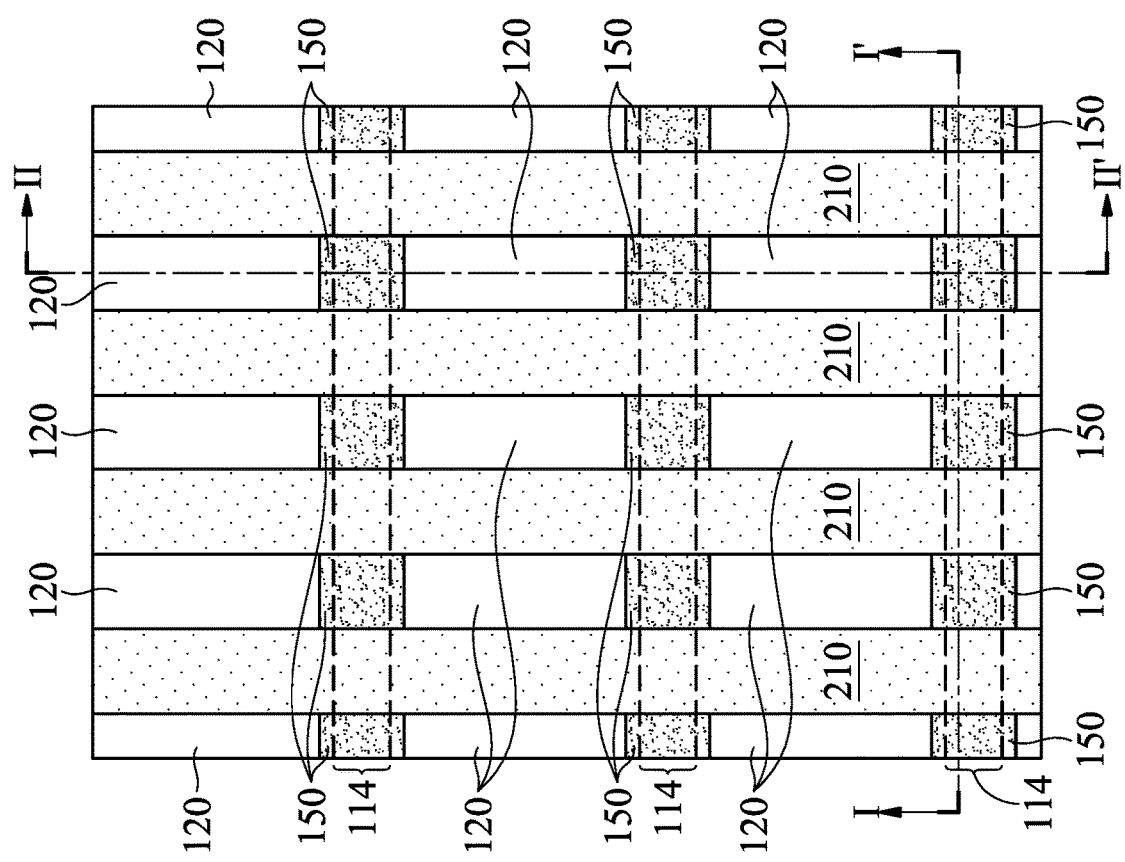
FIGS. 2A-2I are top views of various stages of a process for forming a semiconductor device structure, in accordance with some embodiments.
Figures 1, 2A:
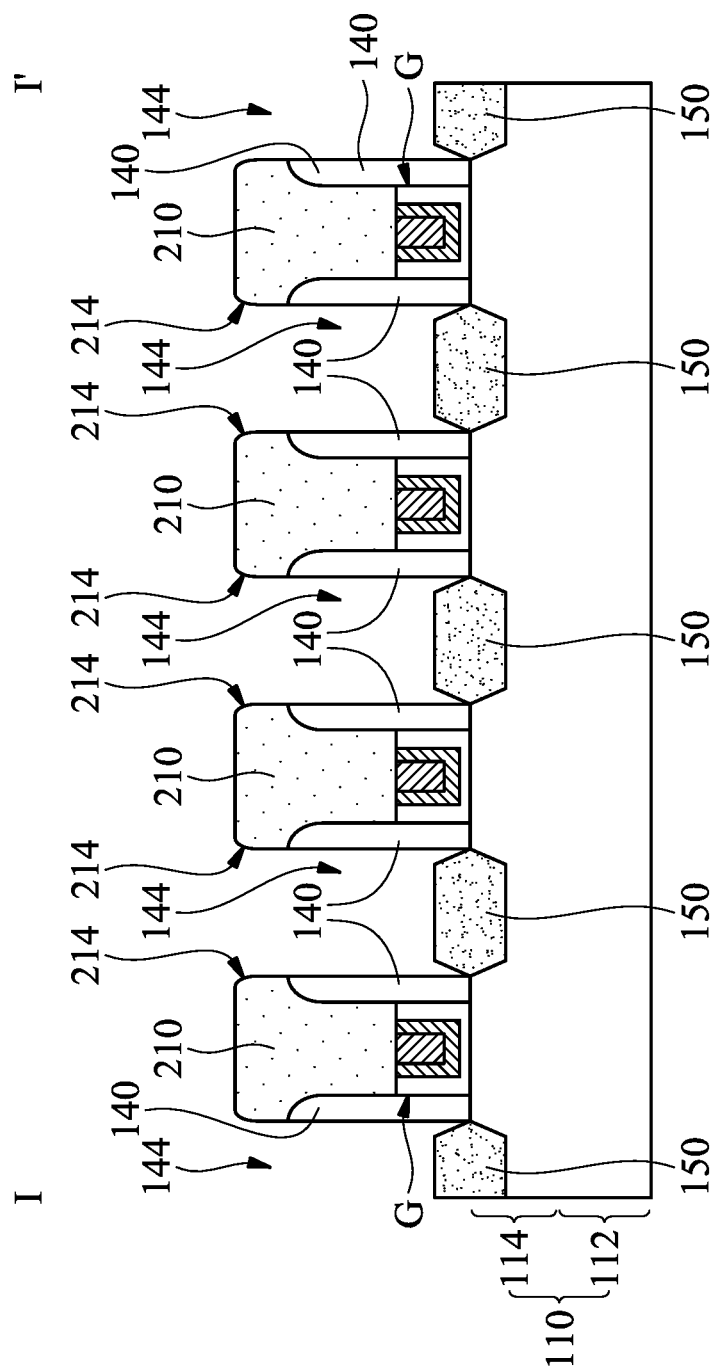
Figures 2, 2A:
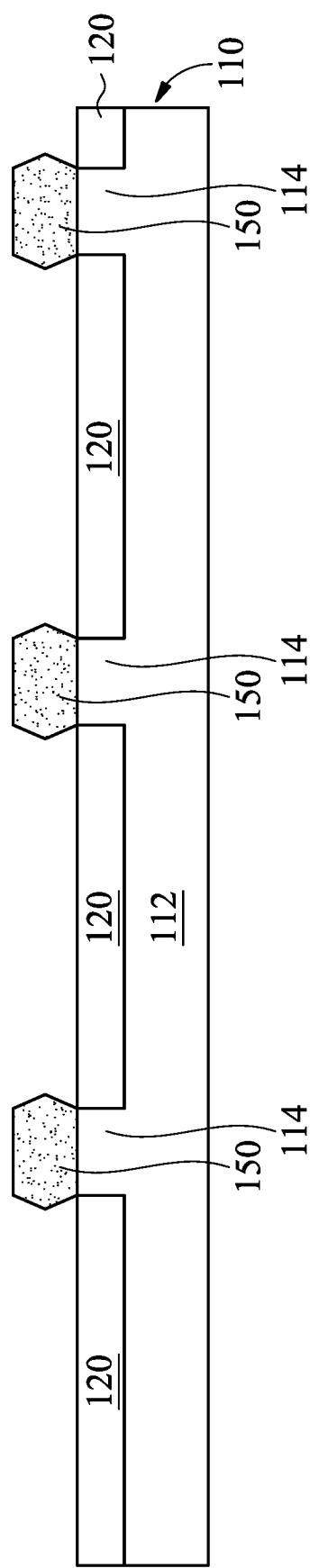
Figure 2B:
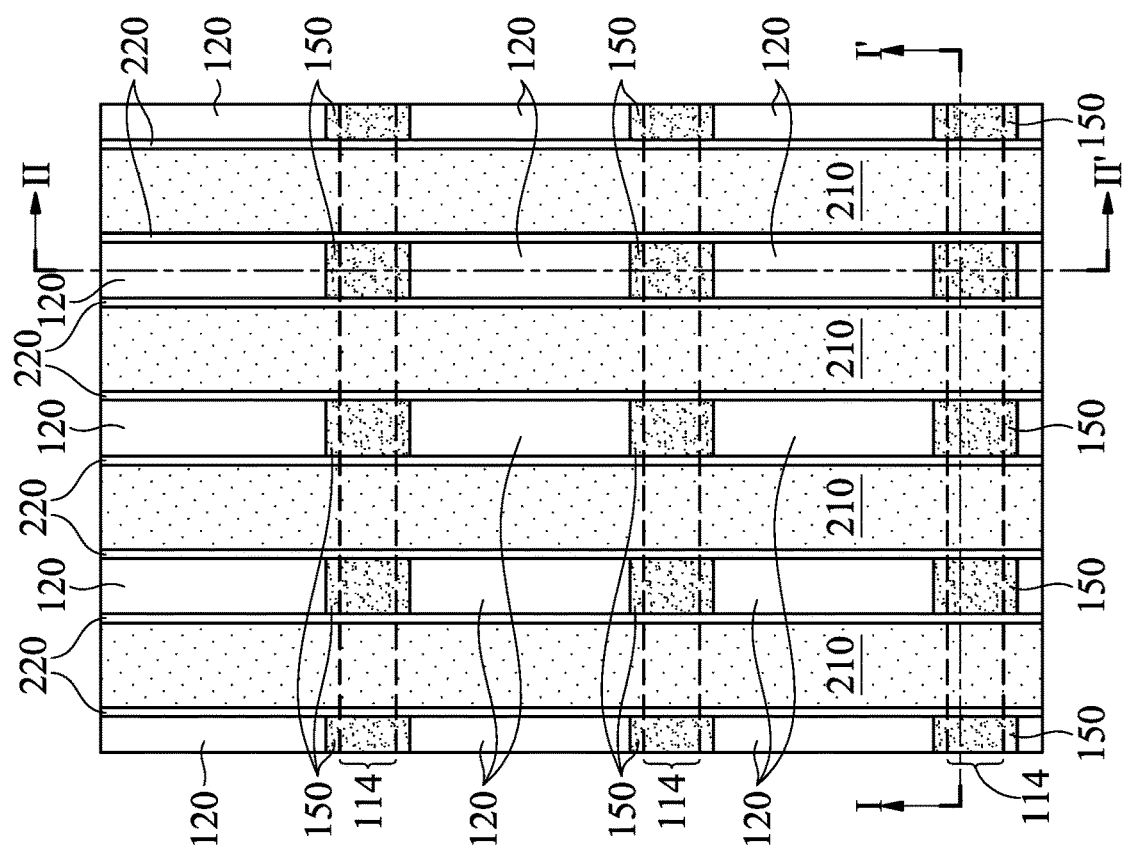
Figures 1, 2B:
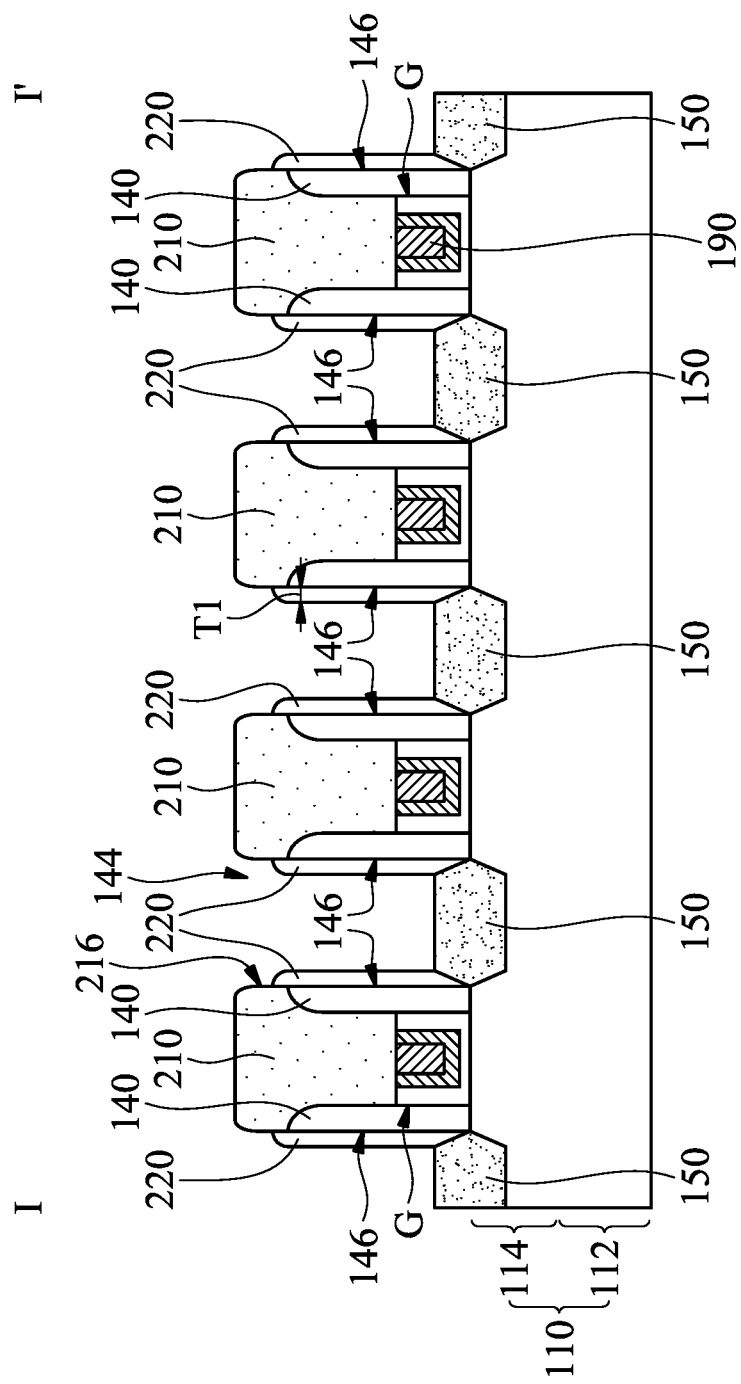
Figures 2, 2B:
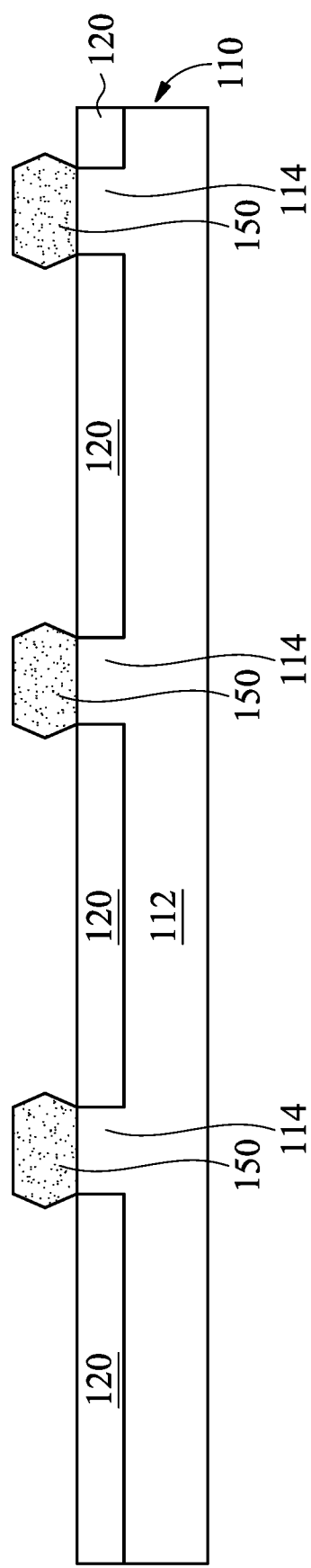
Figure 2C:
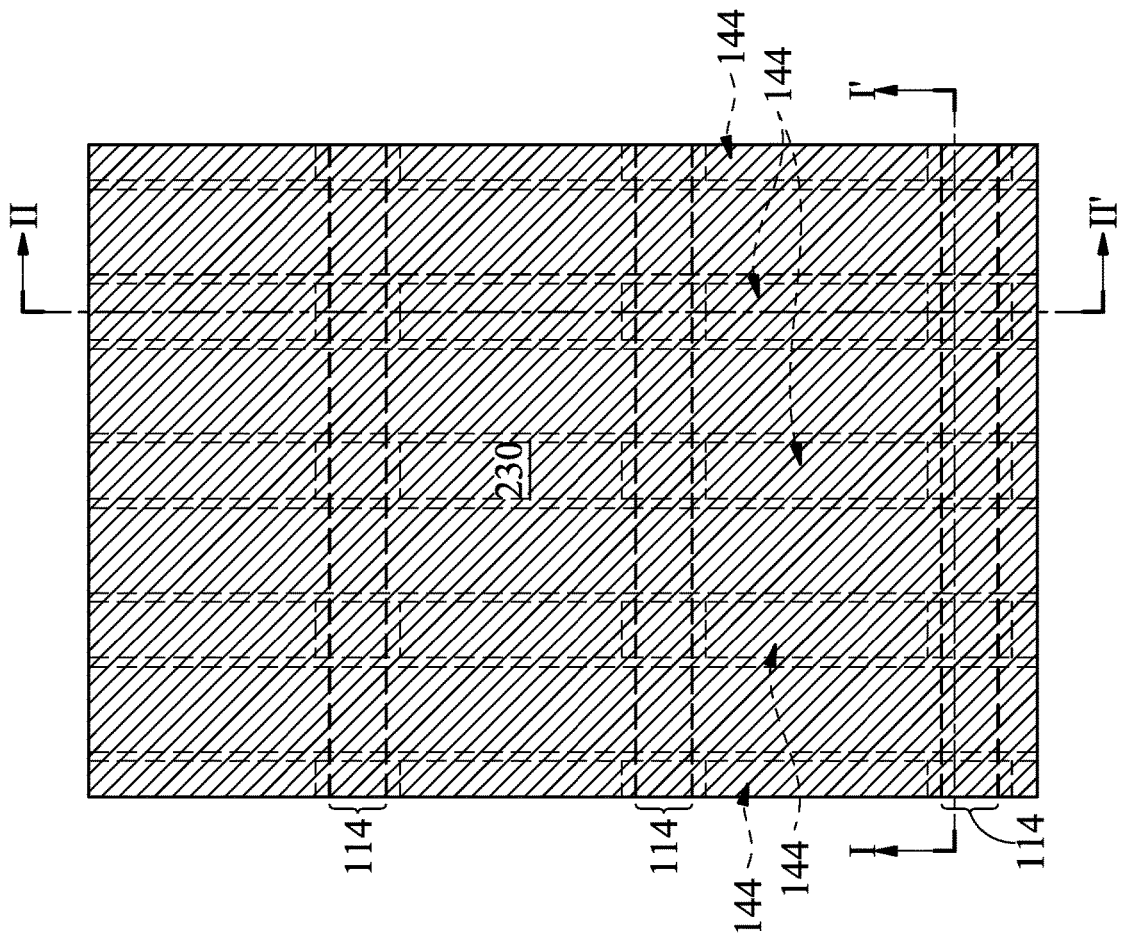
Figures 1, 2C:
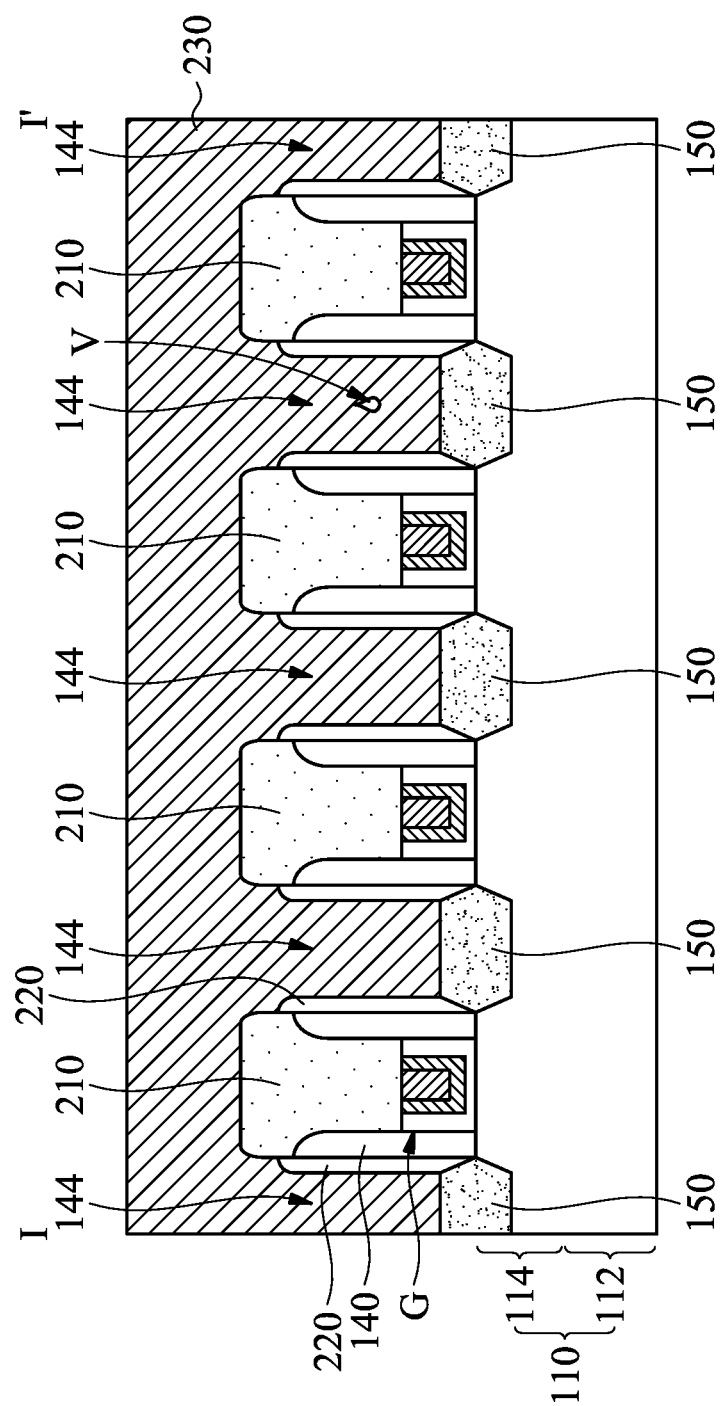
Figures 2, 2C:
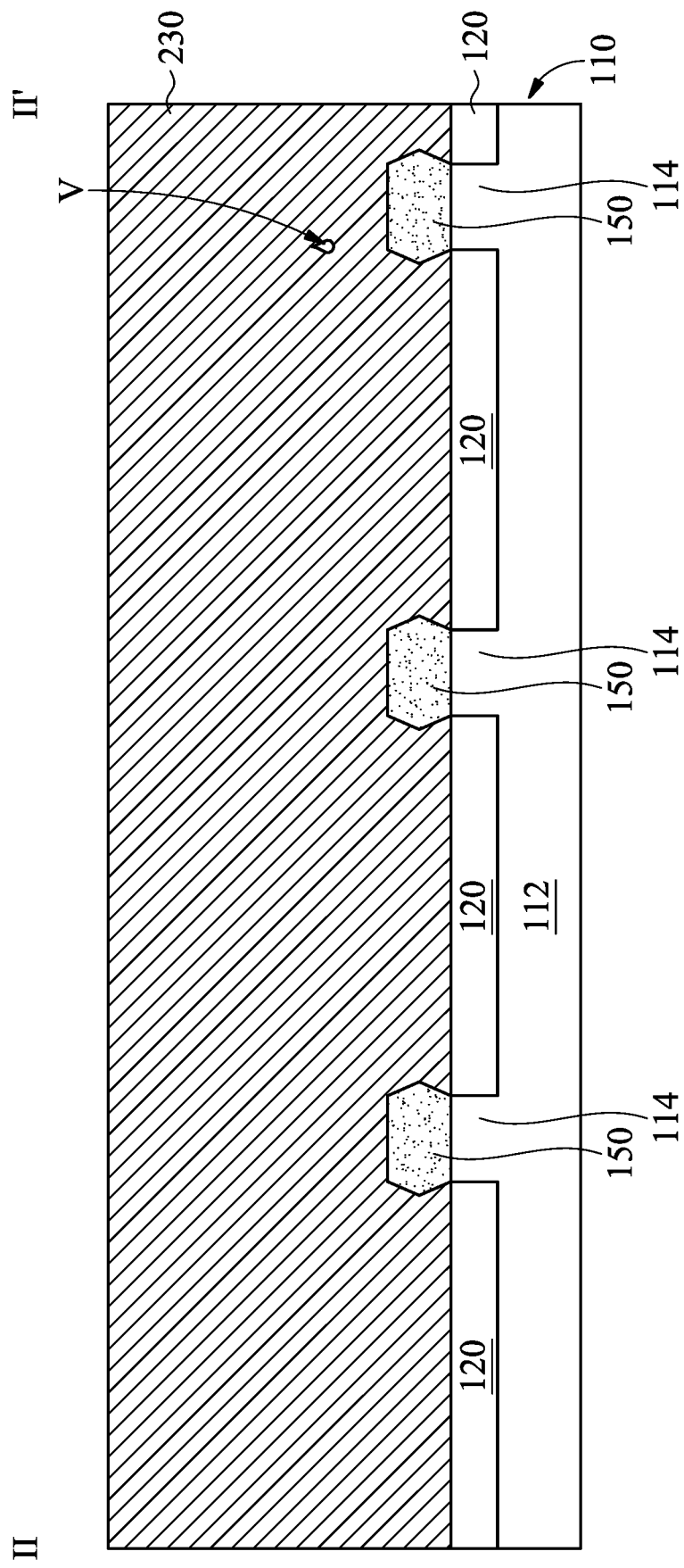
Figure 2D:
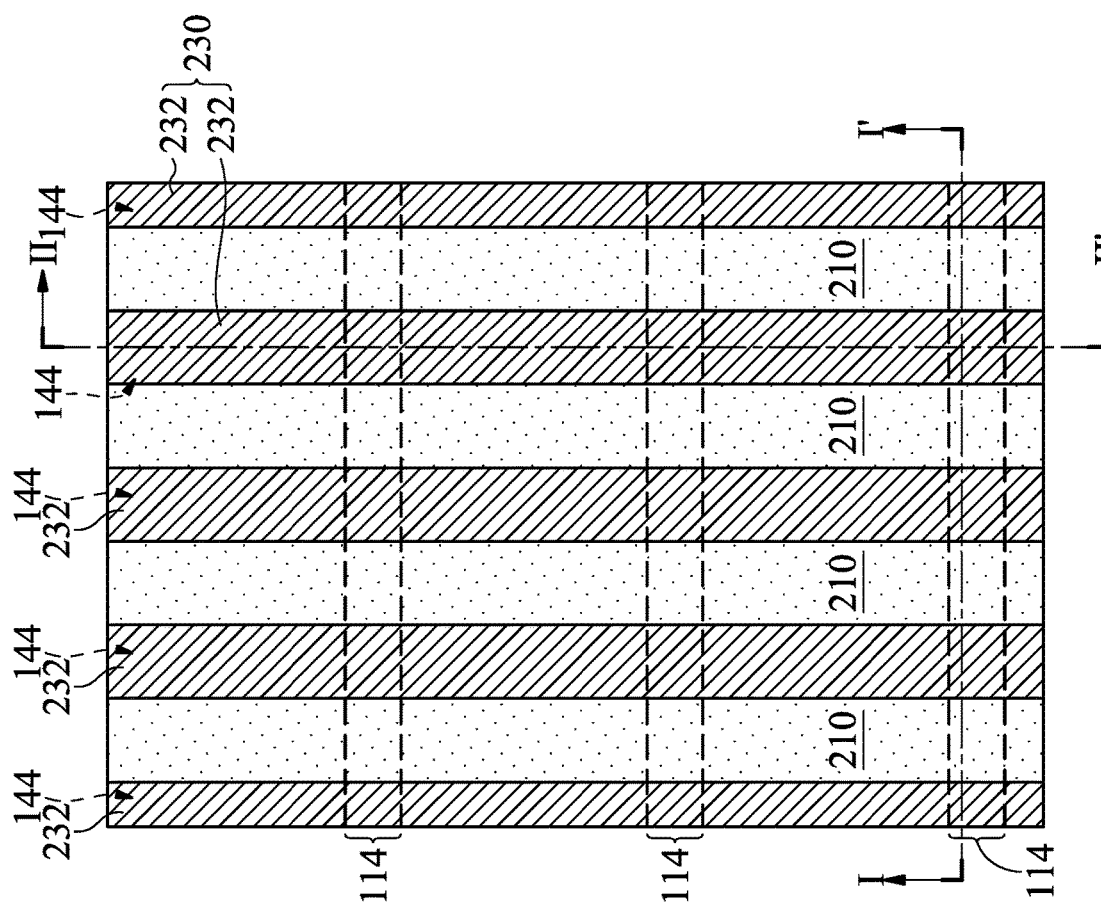
Figures 1, 2D:
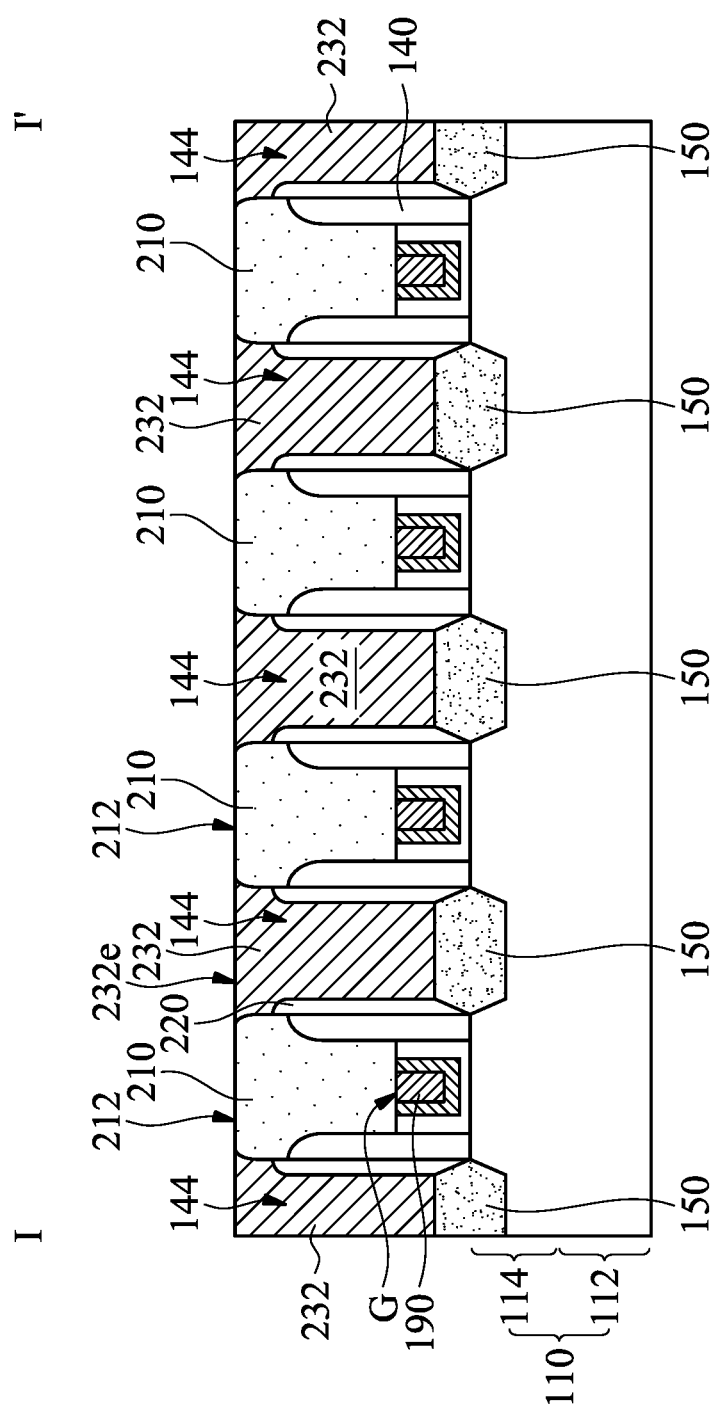
Figures 2, 2D:
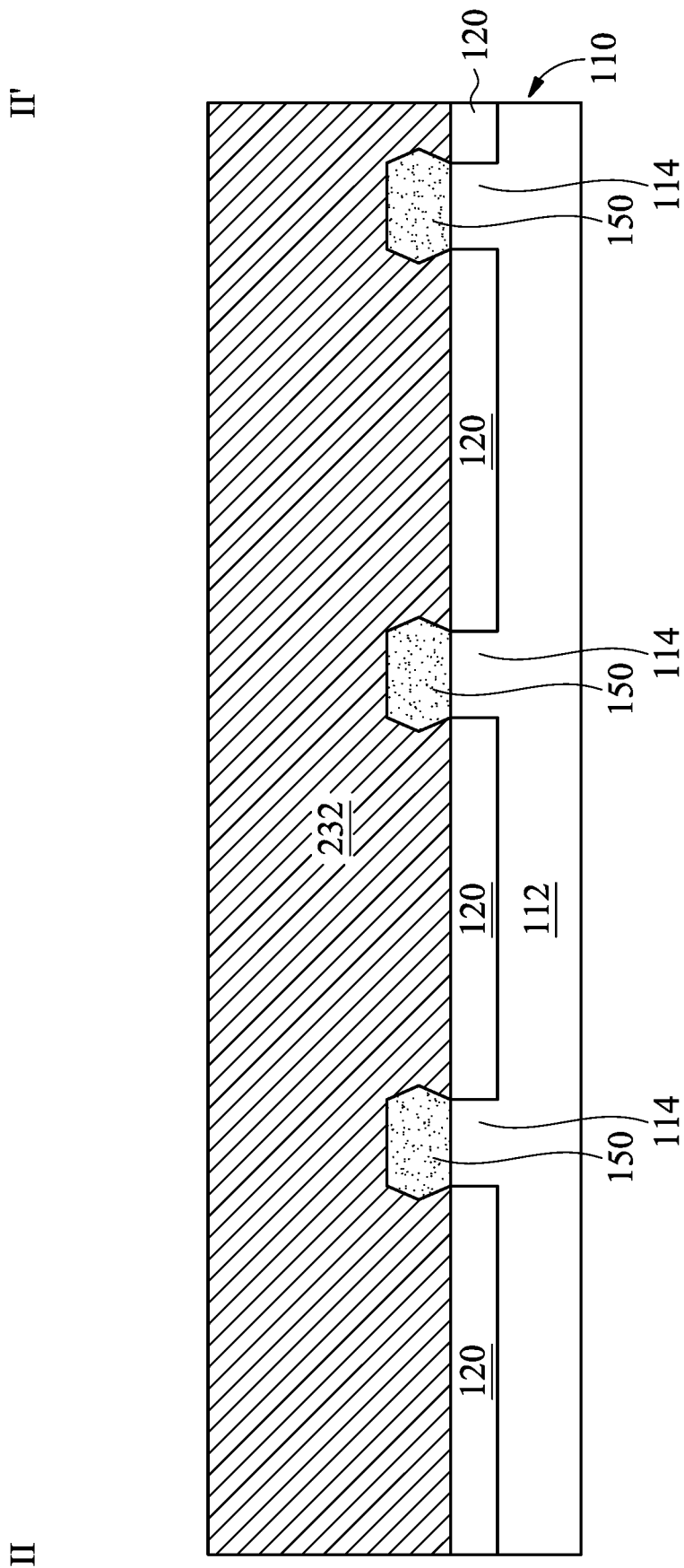
Figure 2E:
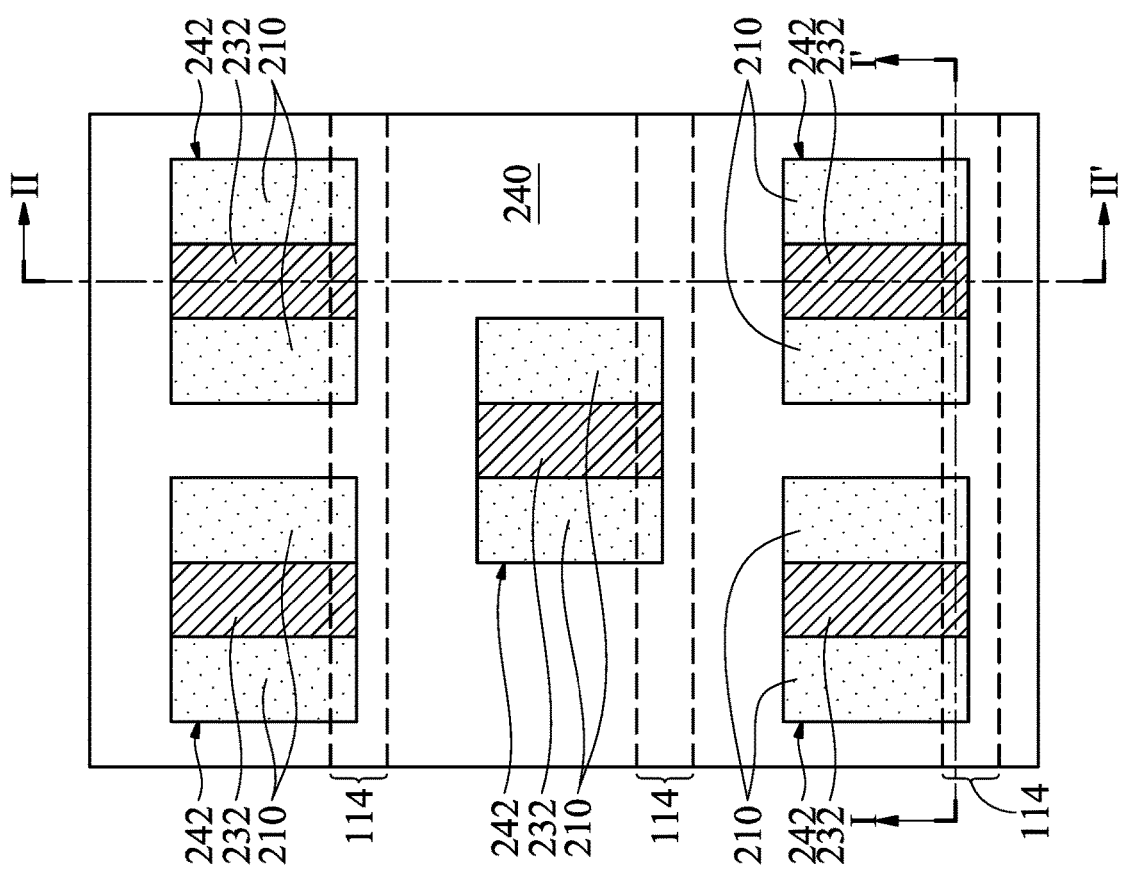
Figures 1, 2E:
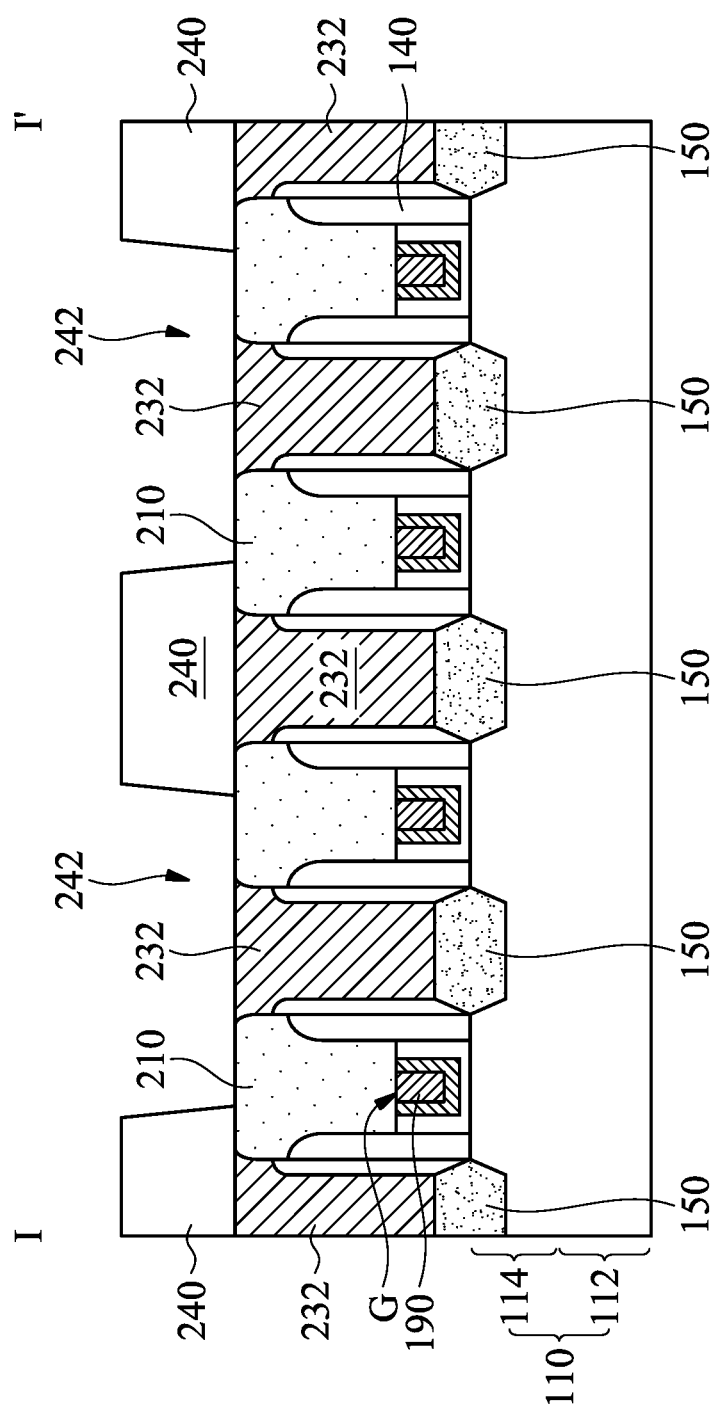
Figures 2, 2E:
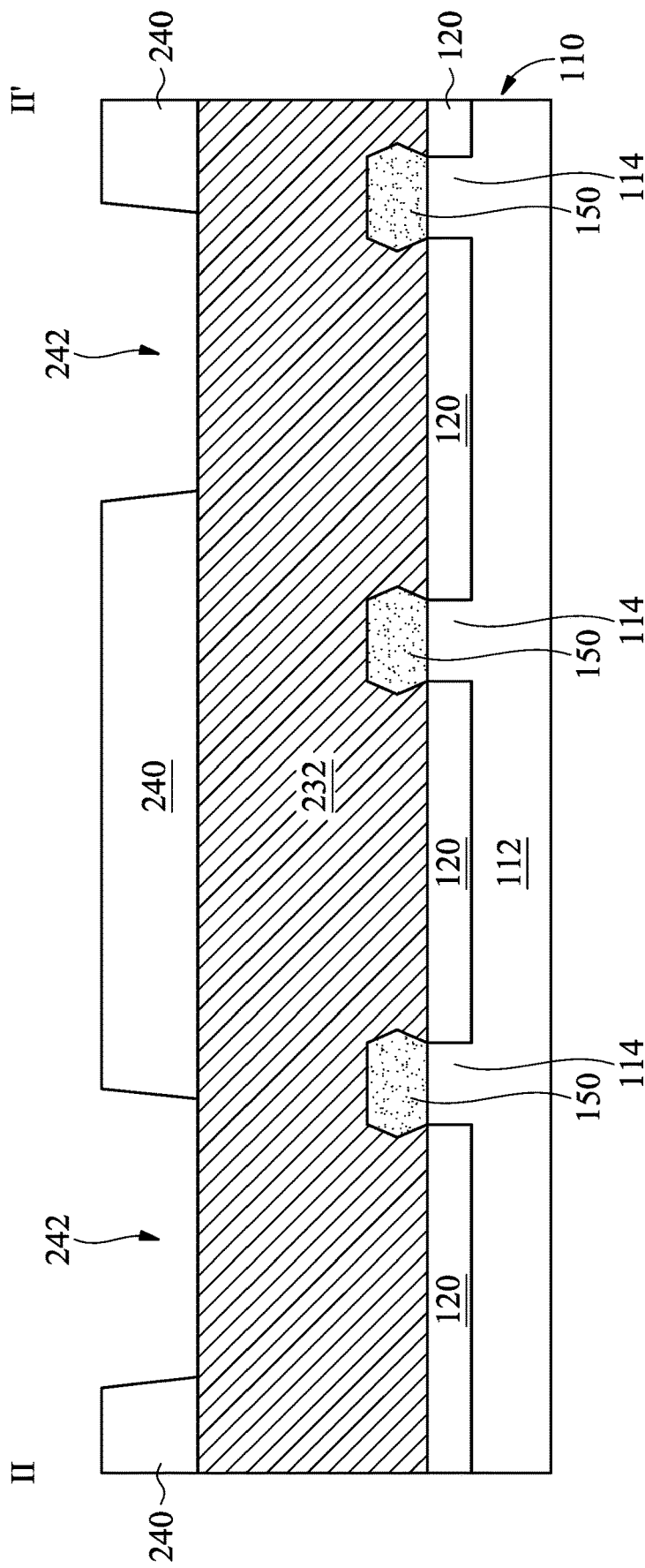
Figure 2F:
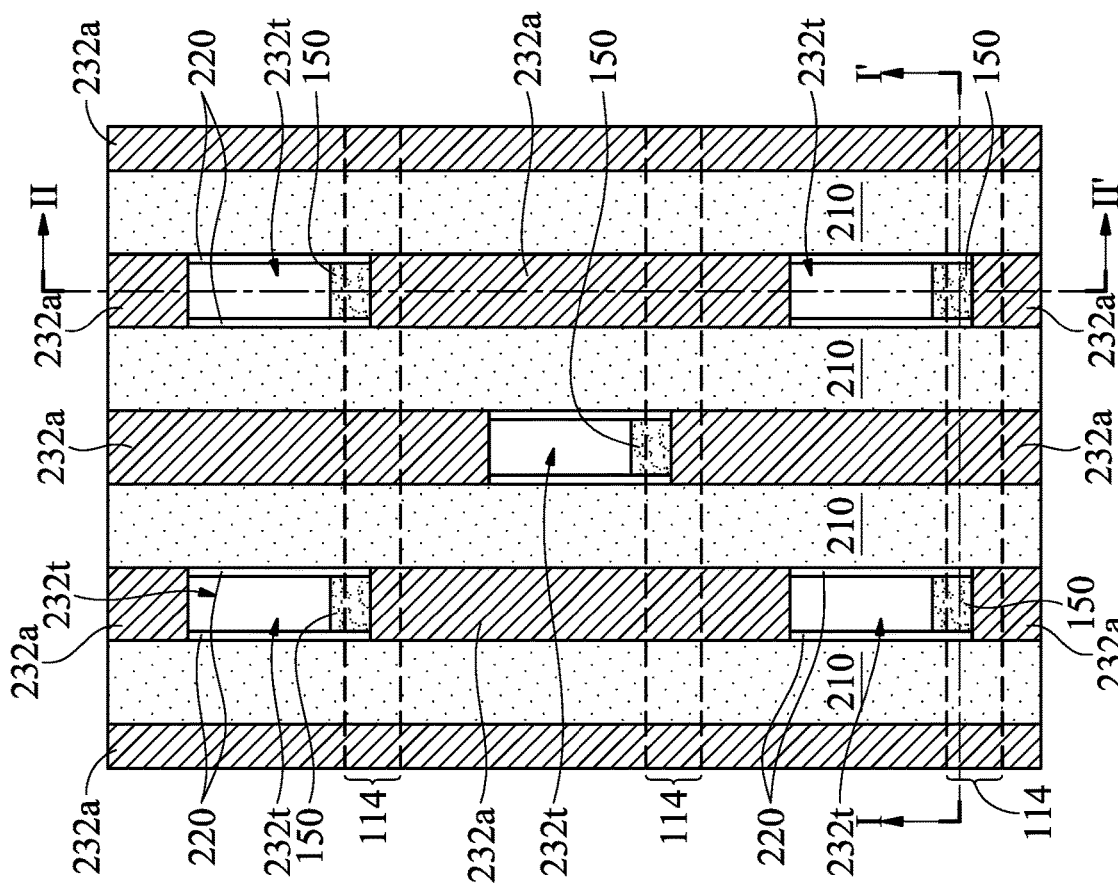
Figures 1, 2F:
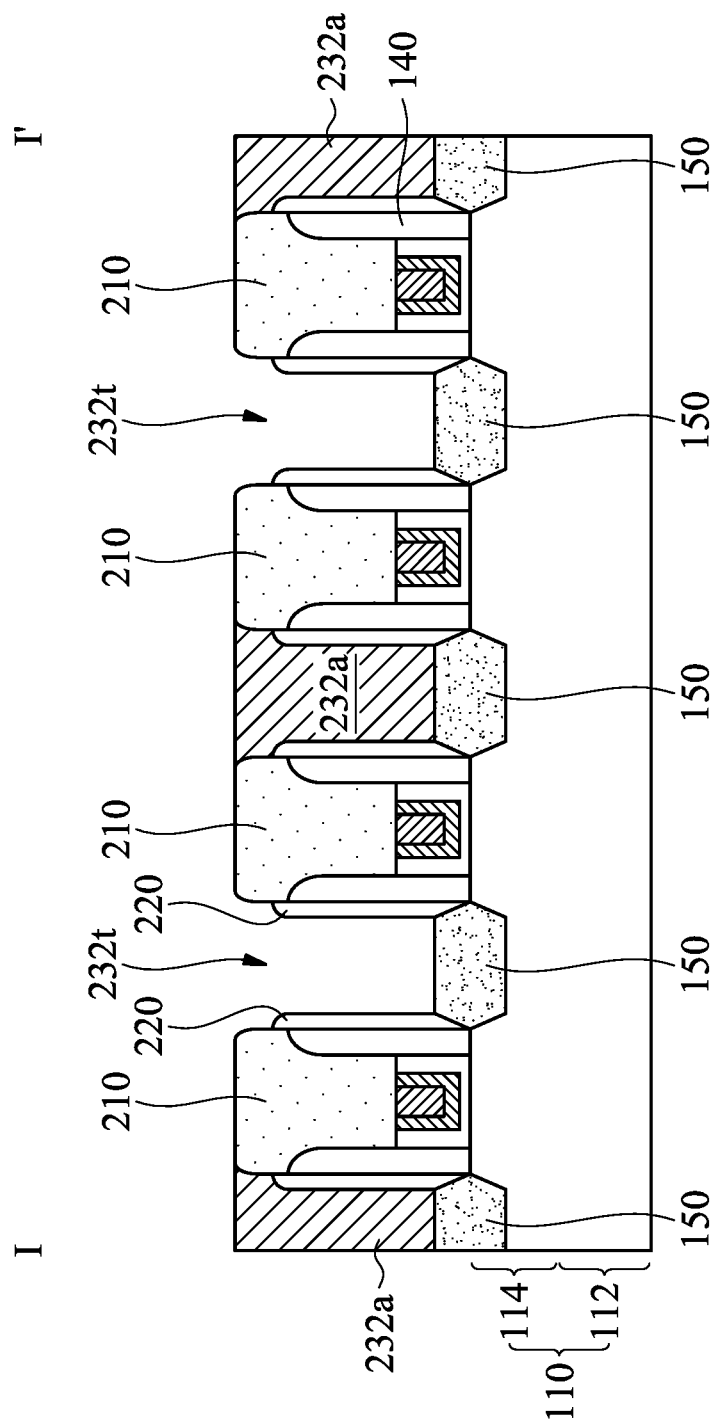
Figures 2, 2F:
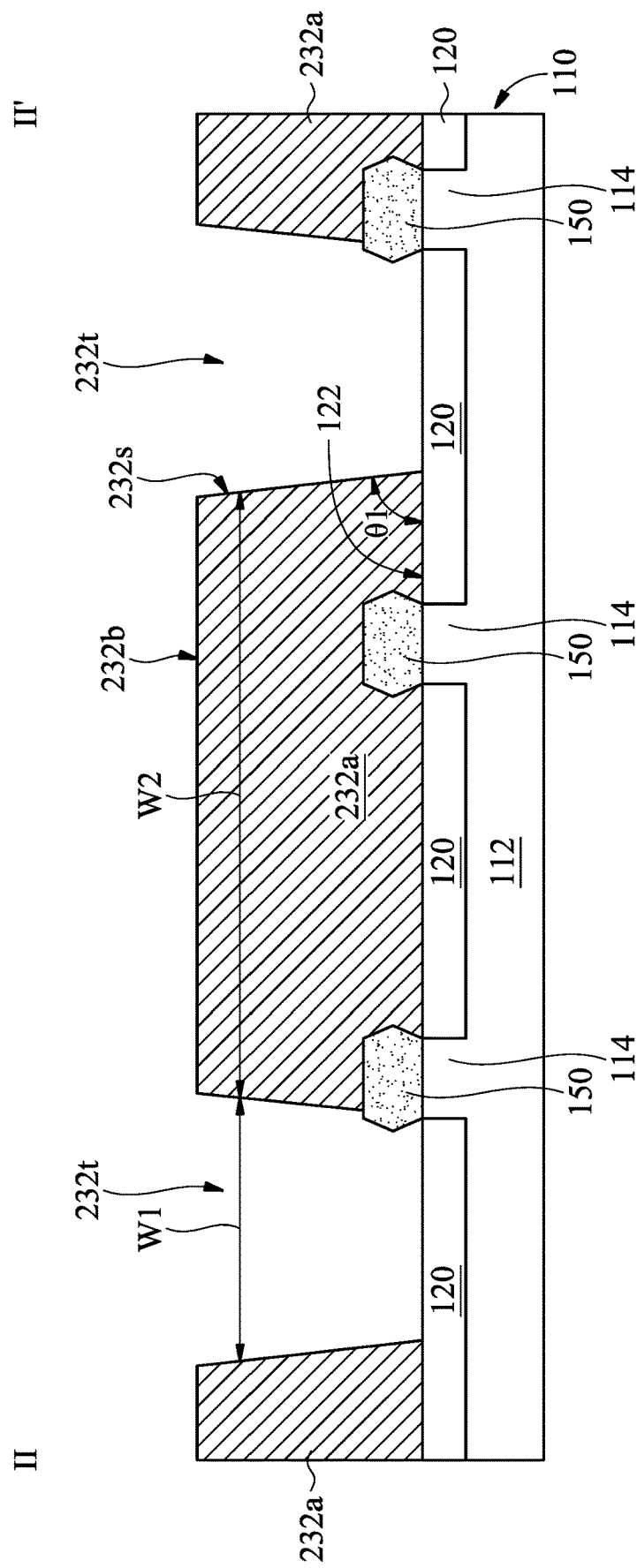
Figure 2G:
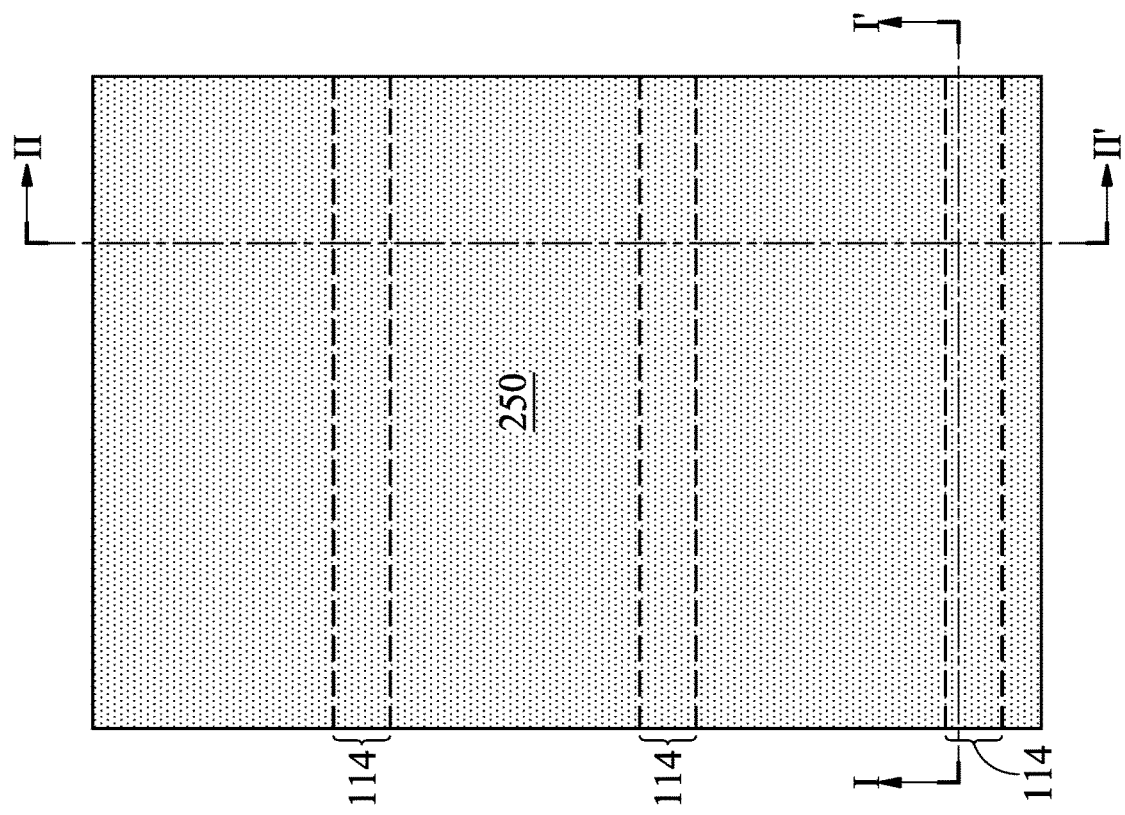
Figures 1, 2G:
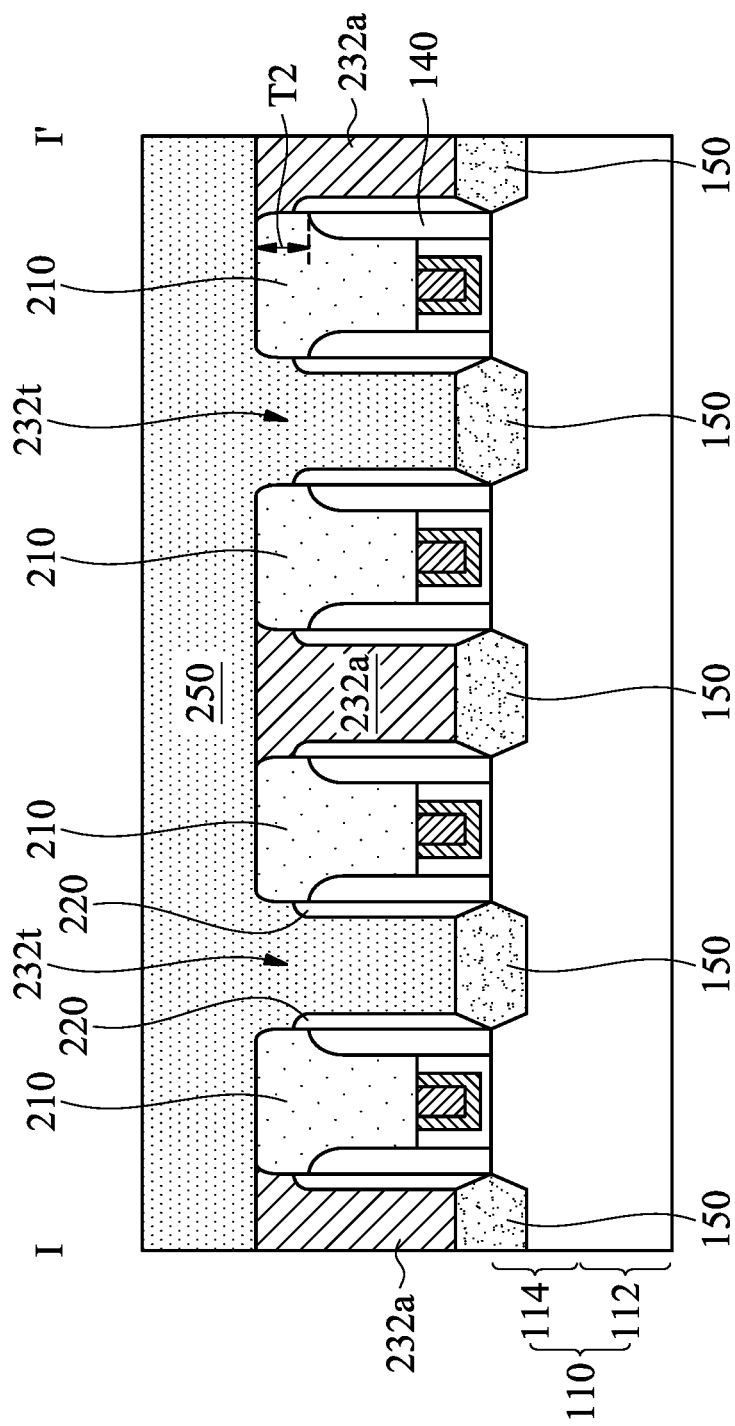
Figures 2, 2G:
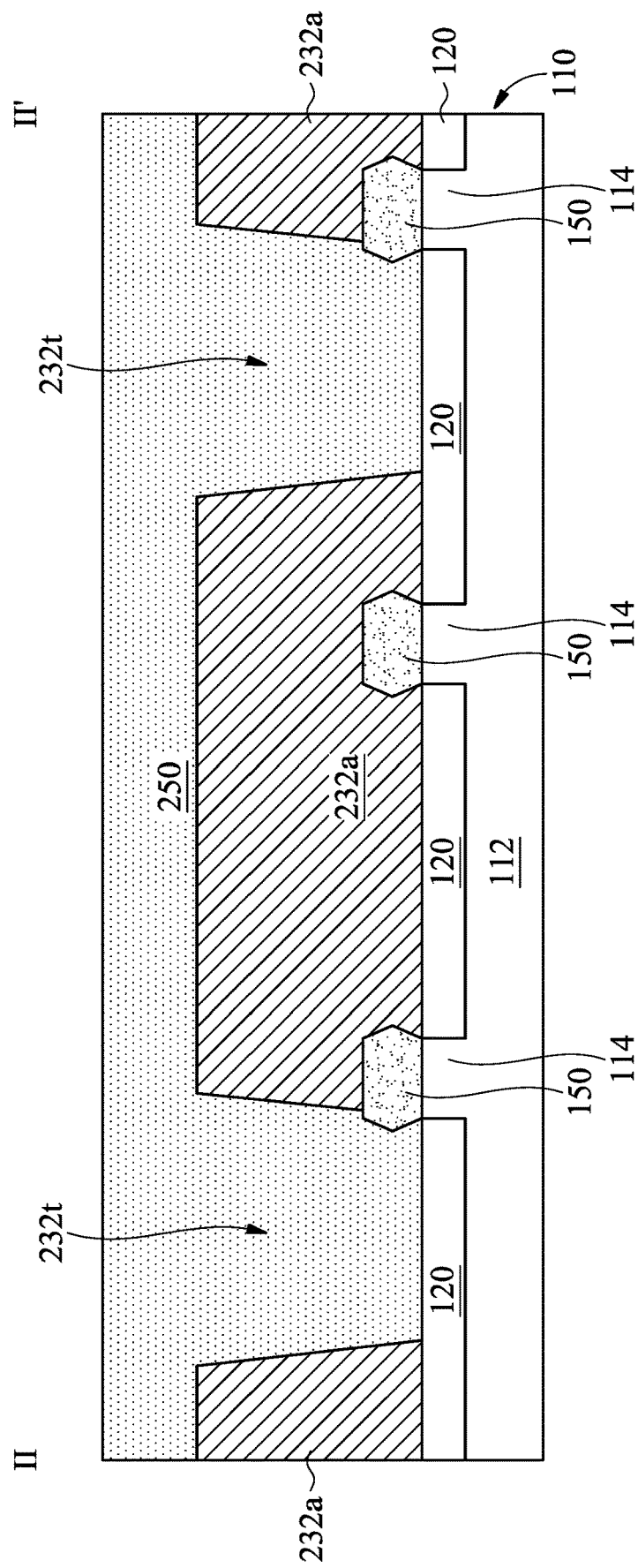
Figure 2H:
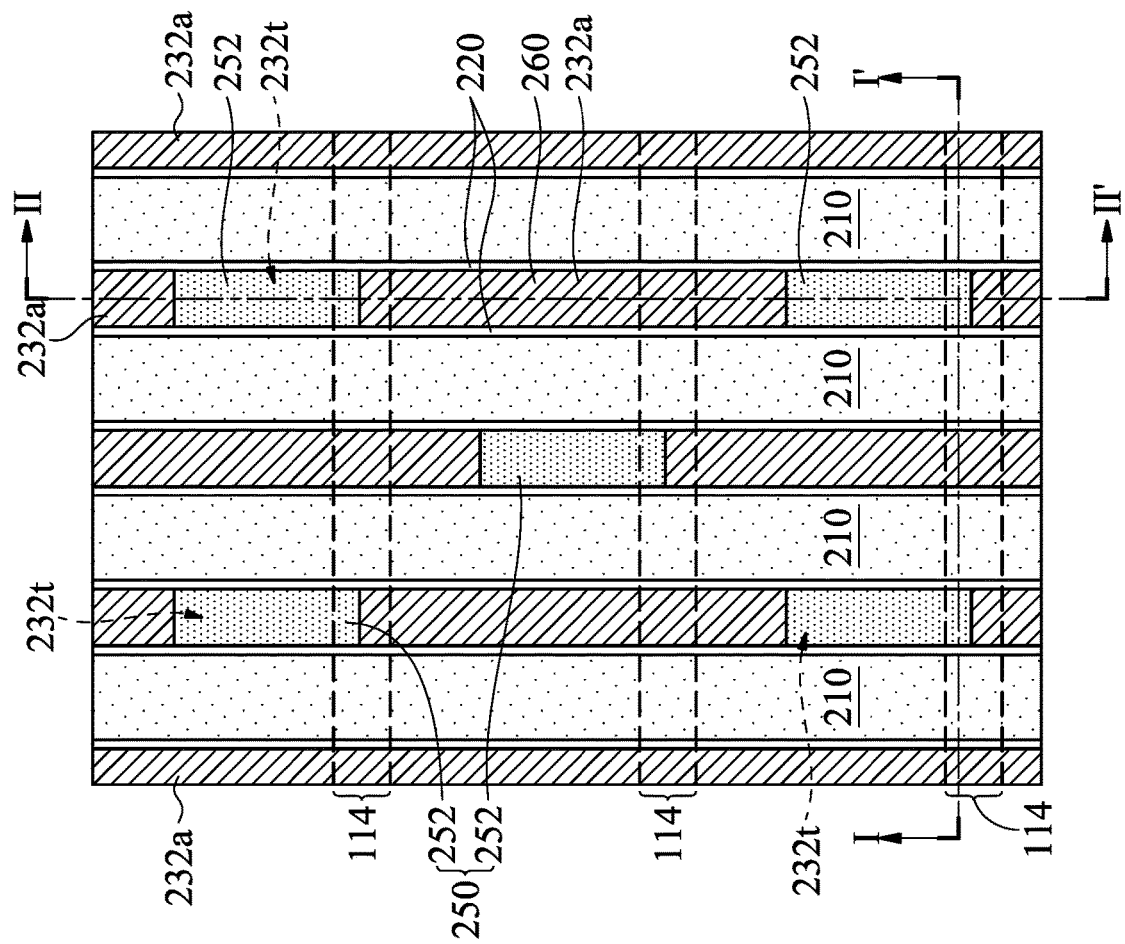
Figures 1, 2H:
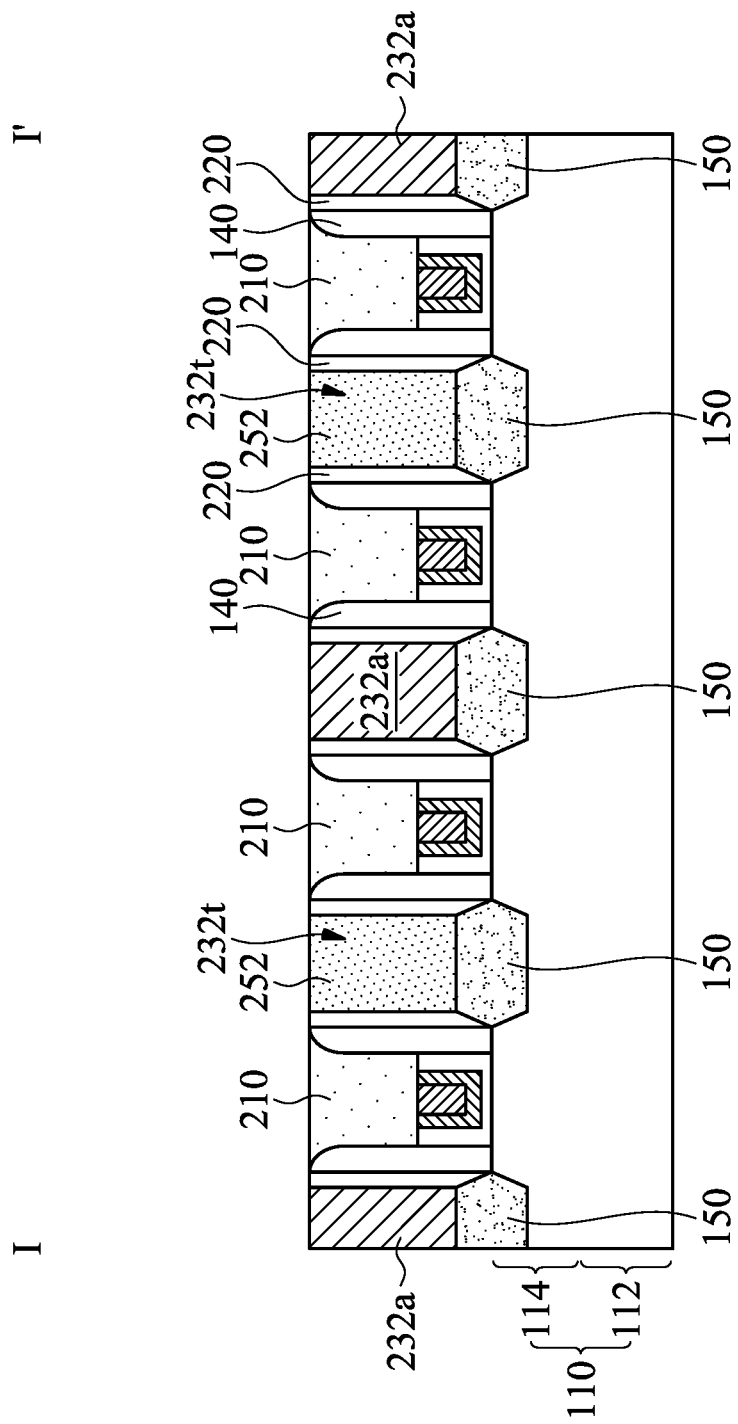
Figures 2, 2H:
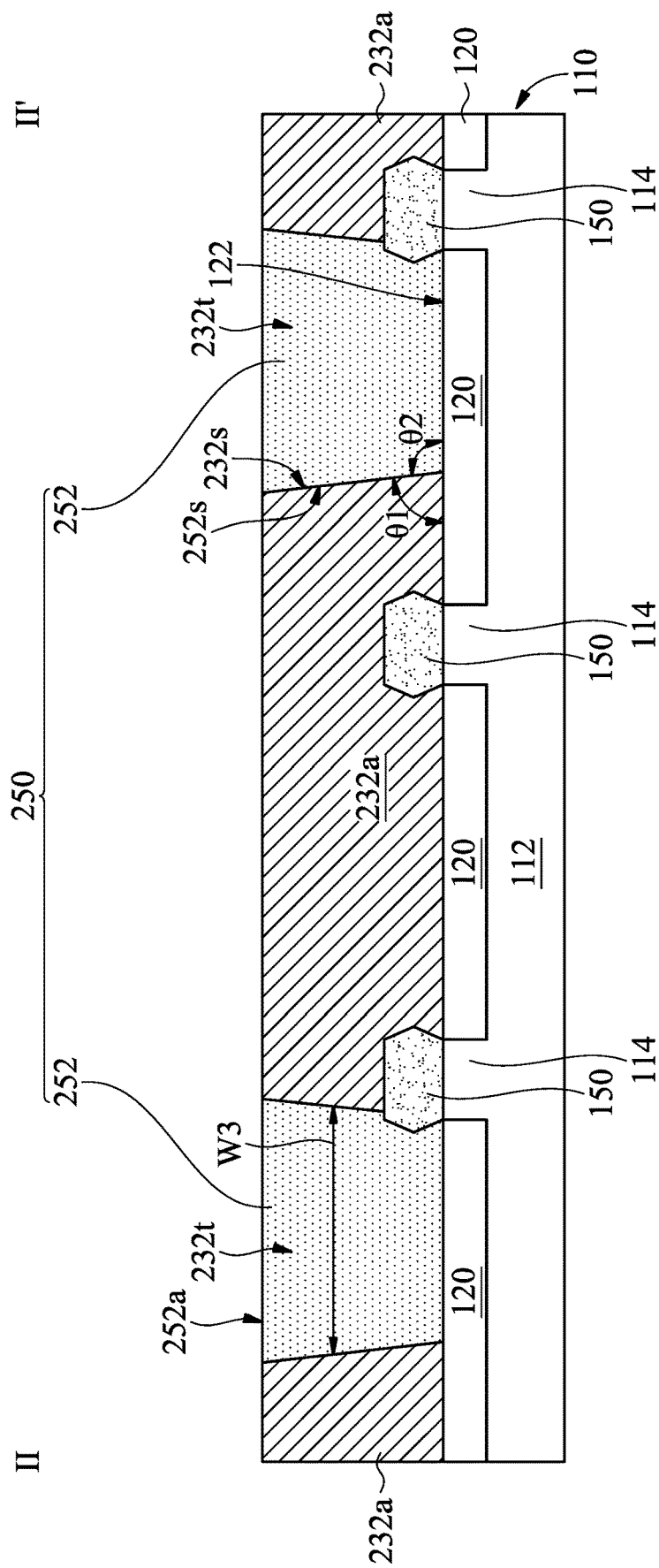
Figure 2I:
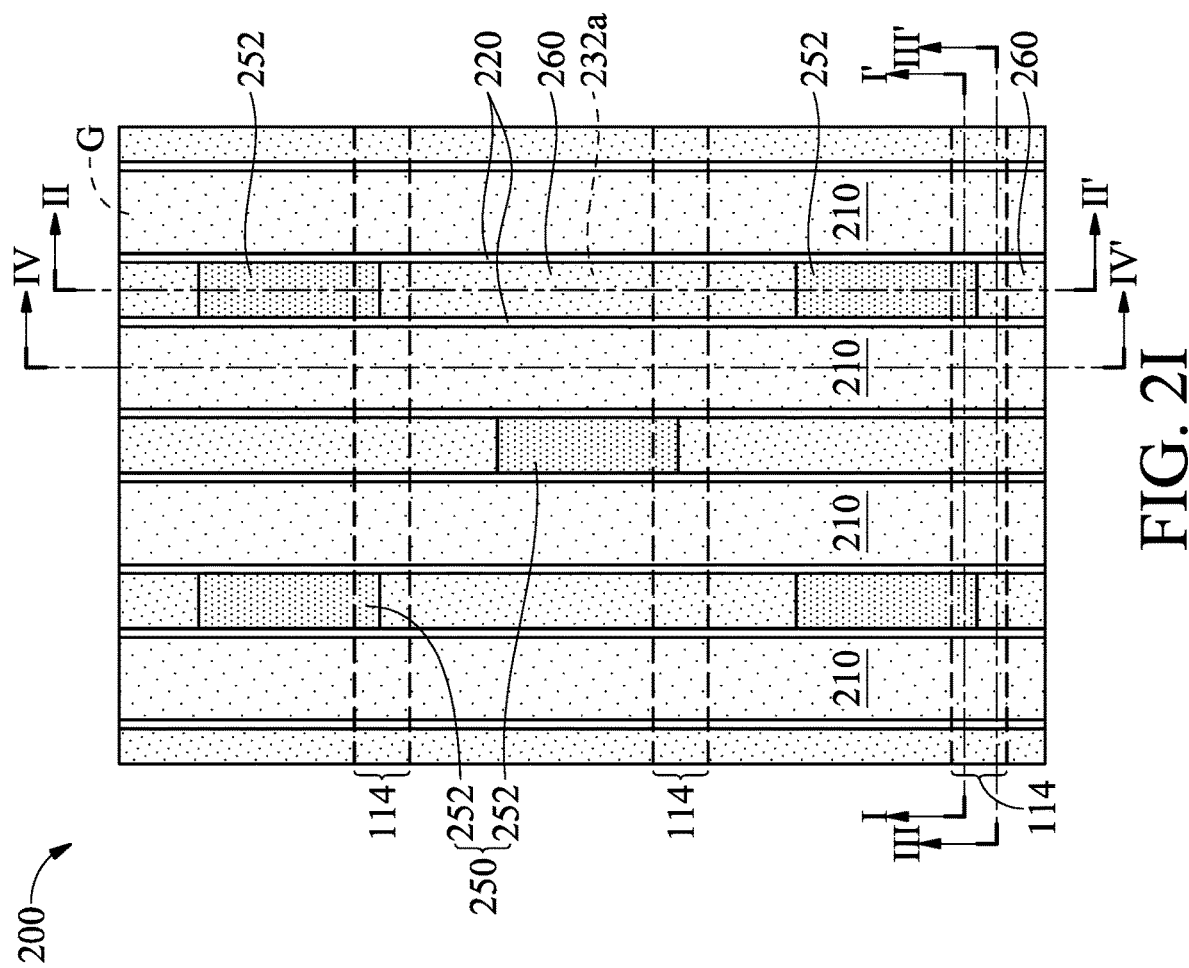
Figures 1, 2I:
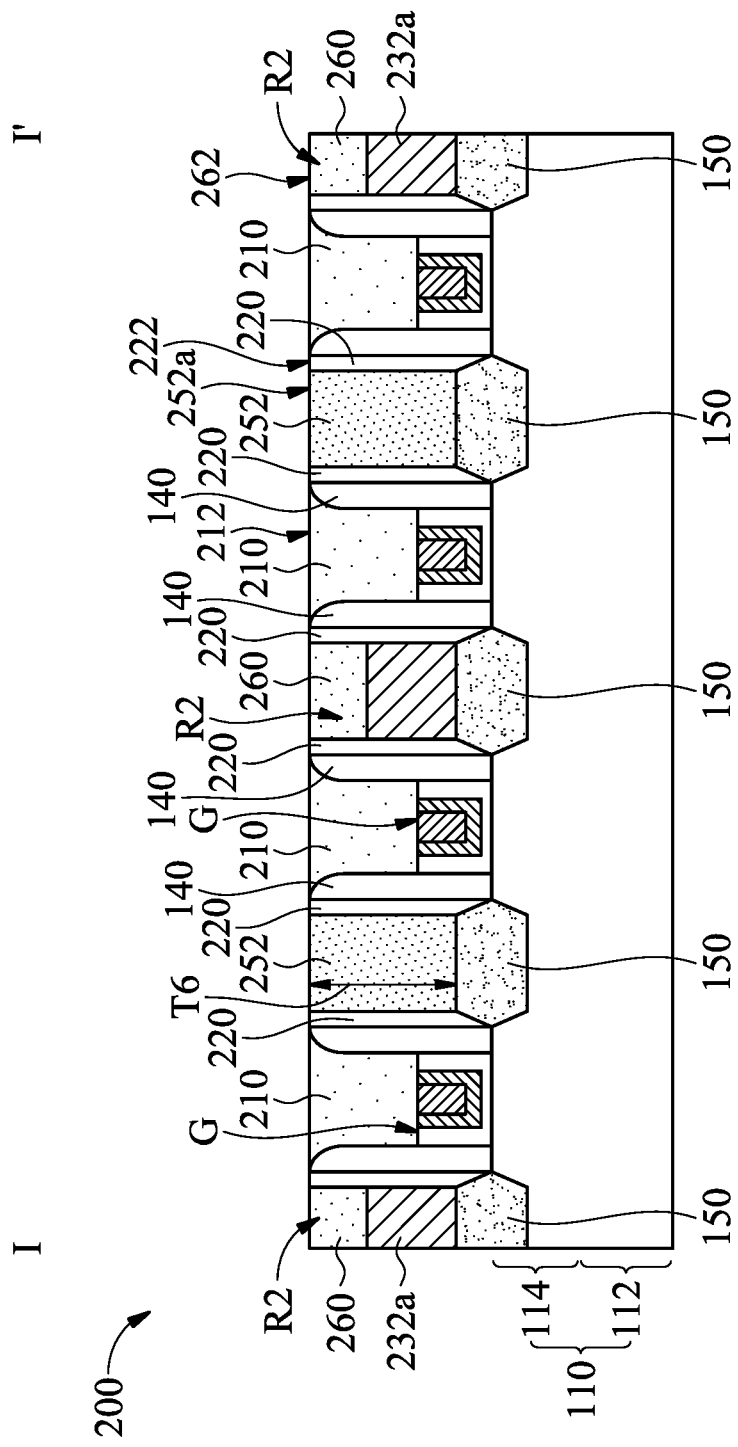
Figures 2, 2I:
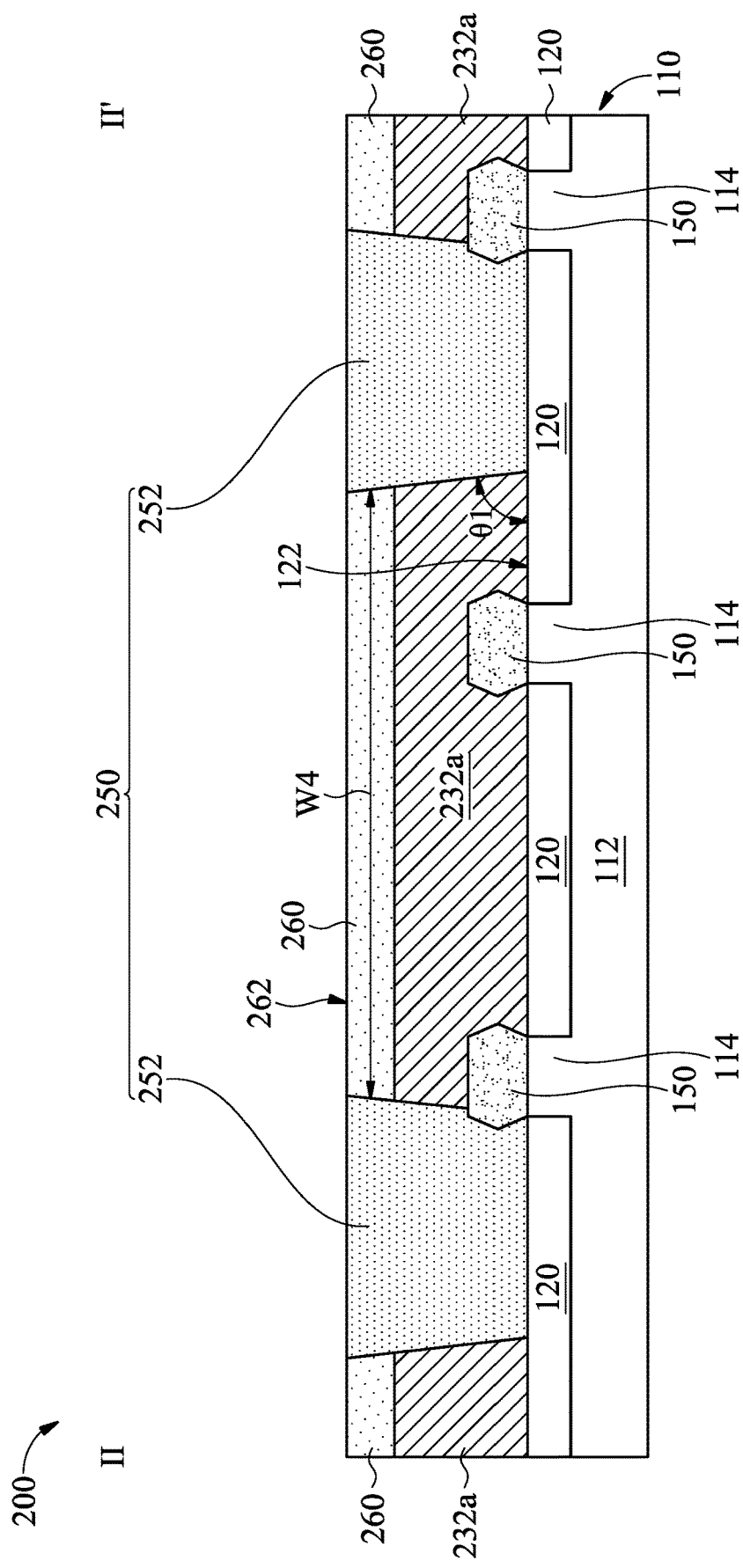
Figures 2, 2I, 3:
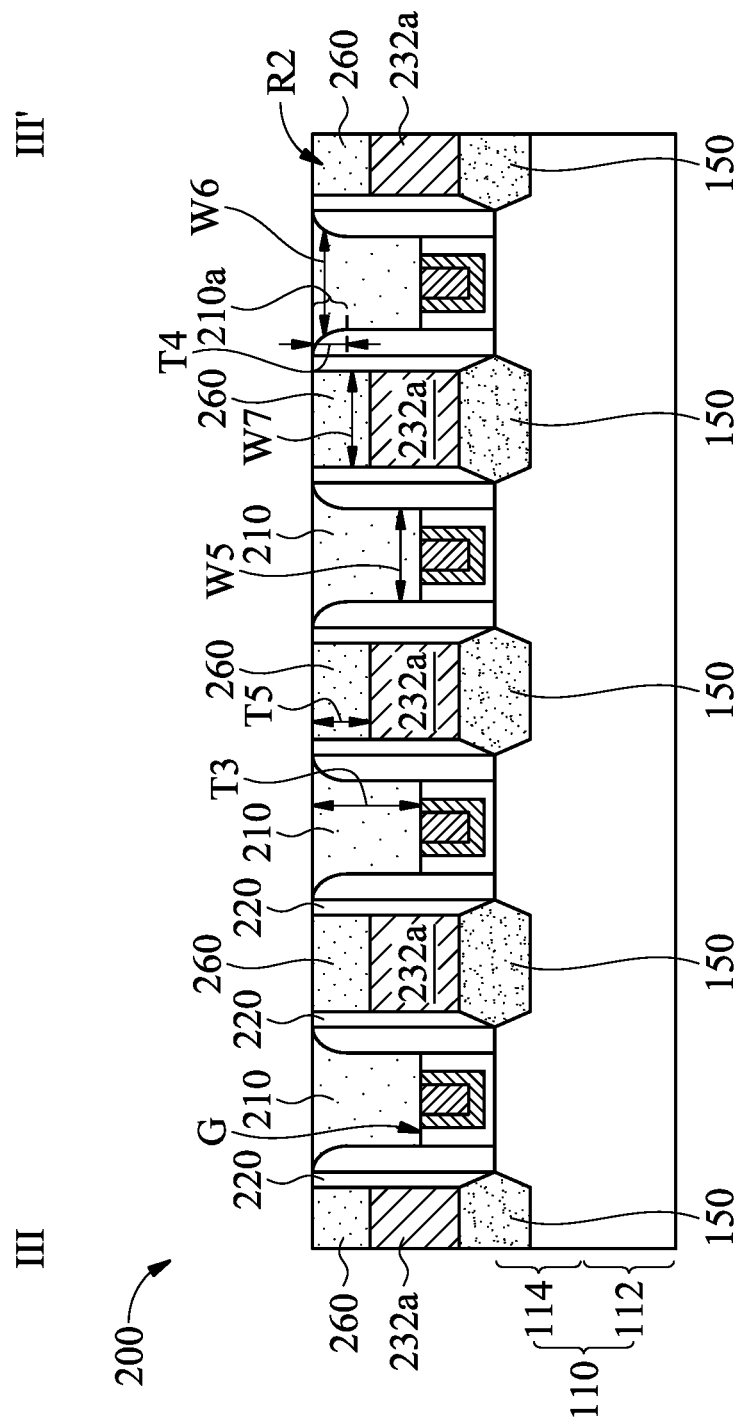
Figures 2, 2I, 3, 4:
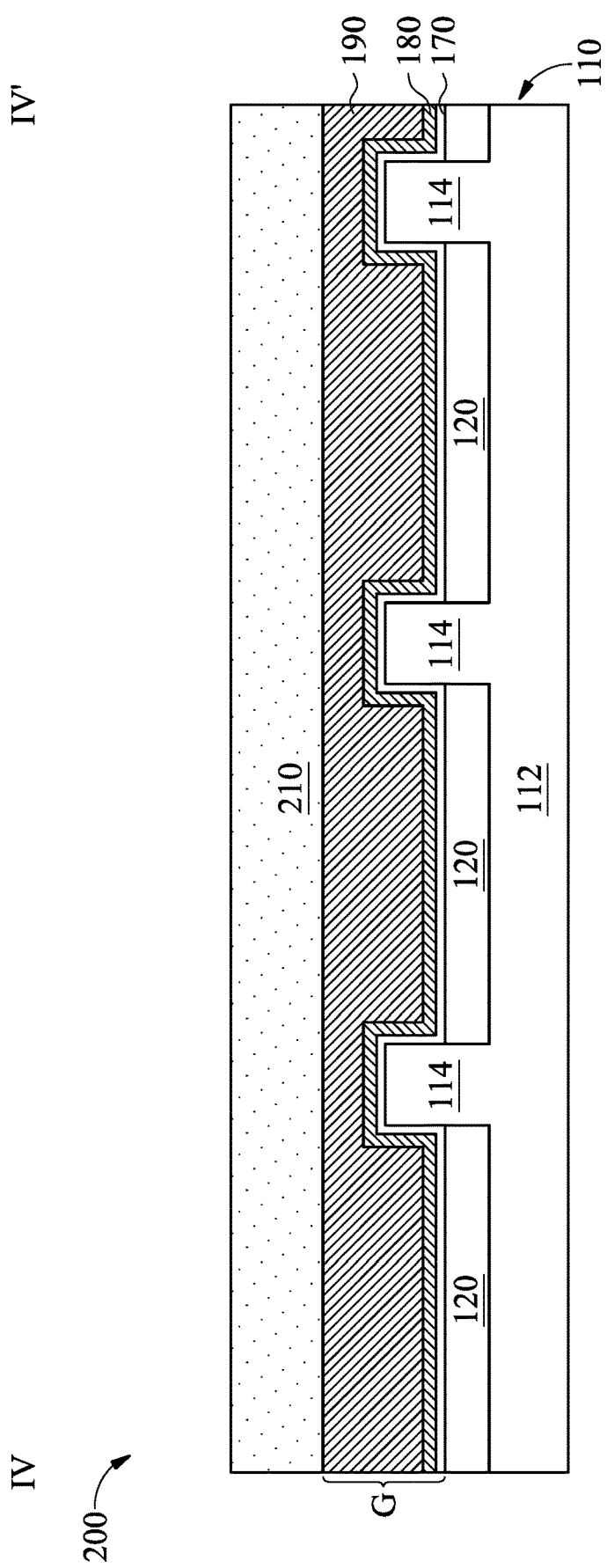
Figures 2, 2I, 3, 4, 5:
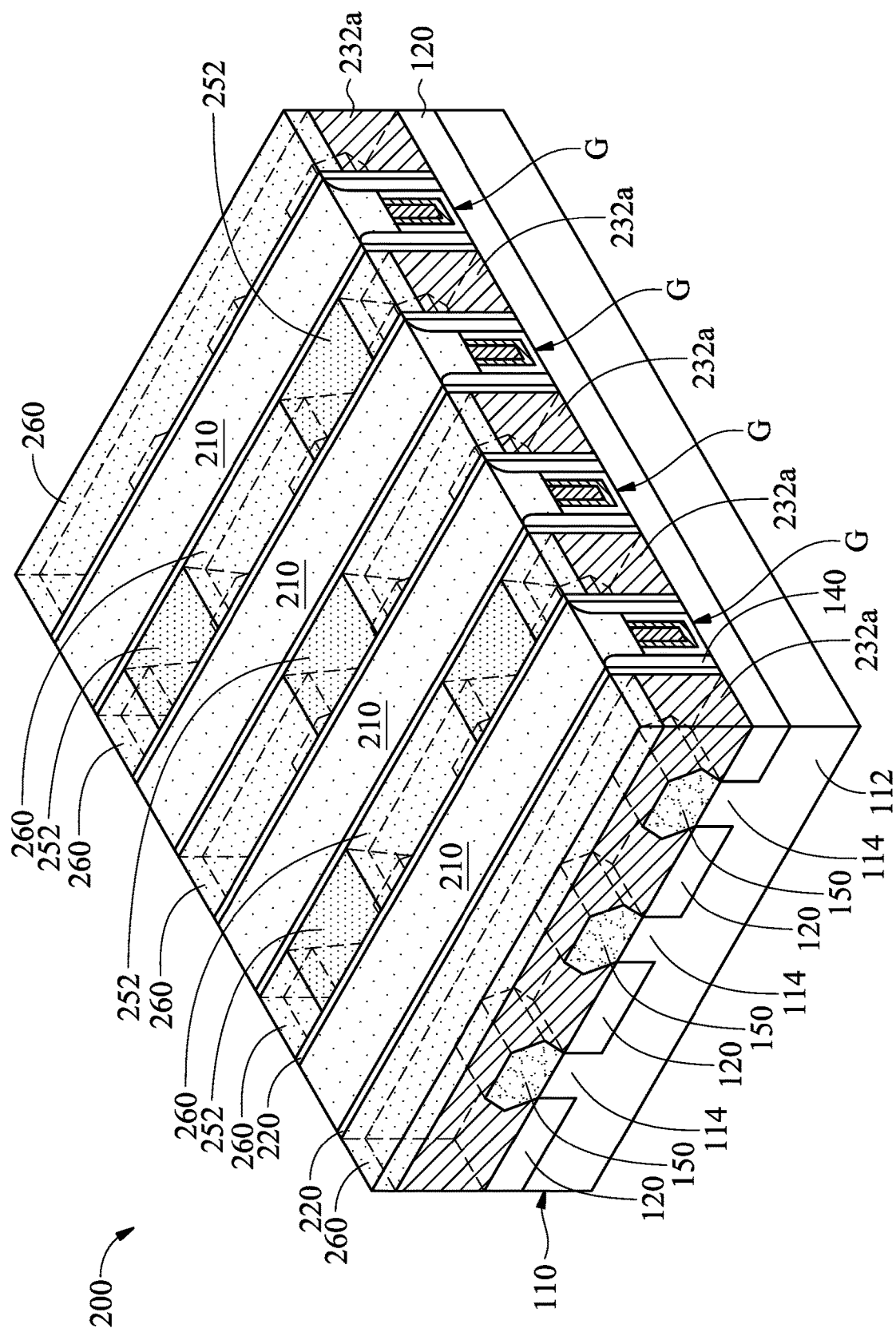
Figure 3:
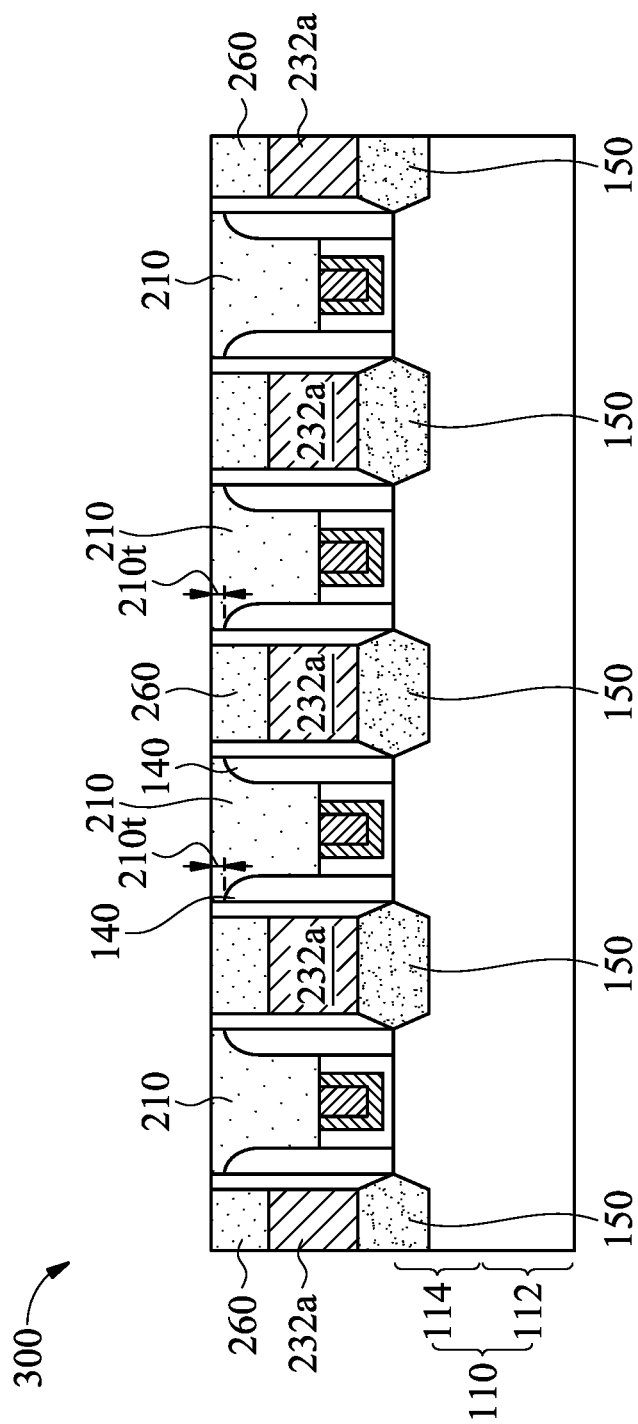

FIGS. 2A-2I are top views of various stages of a process for forming a semiconductor device structure, in accordance with some embodiments. FIG. 2A-1 to FIG. 2I-1 are cross-sectional views illustrating the semiconductor device structure along a sectional line I-I' in FIG. 2A to FIG. 2I, in accordance with some embodiments. FIG. 2A-2 to FIG. 2I-2 are cross-sectional views illustrating the semiconductor device structure along a sectional line II-II' in FIG. 2A to FIG. 2I, in accordance with some embodiments.

After the step of FIG. 1H, as shown in FIGS. 2A, 2A-1, and 2A-2, the dielectric layer 160 is removed, in accordance with some embodiments. After the removal process, trenches 144 are formed between the spacers 140, in accordance with some embodiments. The removal process removes the entire dielectric layer 160, in accordance with some embodiments.

The removal process further removes portions of the cap layer 210, and therefore the cap layer 210 has rounded edges 214, in accordance with some embodiments. The removal process includes an etching process, such as a dry etching process or a wet etching process, in accordance with some embodiments.

As shown in FIGS. 2B, 2B-1, and 2B-2, a liner layer 220 is formed over sidewalls 146 of the spacers 140 and sidewalls 216 of the cap layer 210, in accordance with some embodiments. The liner layer 220 conformally covers the sidewalls 146 and 216, in accordance with some embodiments. The liner layer 220 is configured to electrically isolate the gate electrodes 190 from contact structures subsequently formed in the trenches 144, in accordance with some embodiments.

As shown in FIG. 2B-1, a thickness T1 of the liner layer 220 ranges from about 1 nm to about 20 nm, in accordance with some embodiments. If the thickness T1 is less than 1 nm, the liner layer 220 is too thin to electrically isolate the gate electrodes 190 from the contact structures, in accordance with some embodiments. If the thickness T1 is greater than 20 nm, the trenches 144 are significantly narrowed by the liner layer 220, which may hinder the formation of the contact structures in the trenches 144, in accordance with some embodiments.

The liner layer 220 is made of a nitrogen containing material, such as silicon nitride (SiN), aluminum oxynitride (AlON), zirconium nitride (ZrN), tantalum carbonitride (TaCN), silicon oxycarbonitride (SiOCN), or silicon carbonitride (SiCN), in accordance with some embodiments.

In some other embodiments, the liner layer 220 is made of metal oxides, such as lanthanum oxide (LaO), aluminum oxide (AlO), zirconium oxide (ZrO), hafnium oxide (HfO), zinc oxide (ZnO), zirconium aluminum oxide (ZrAlO), titanium oxide (TiO), tantalum oxide (TaO), or yttrium oxide (YO), in accordance with some embodiments. In some embodiments, the liner layer 220 is made of a silicon containing material, such as silicon carbide (SiC), silicon (Si), zirconium silicide (ZrSi), hafnium silicide (HfSi), silicon oxycarbide (SiOC), or silicon oxide (SiO).

The formation of the liner layer 220 includes conformally depositing the liner layer 220 over the cap layer 210, the spacers 140, the stressors 150, and the isolation layer 120; and performing an anisotropic etching process over the liner layer 220 to partially remove the liner layer 220, in accordance with some embodiments. The anisotropic etching process includes a dry etching process, such as a plasma etching process, in accordance with some embodiments. In some other embodiments, the liner layer 220 is not formed.

As shown in FIGS. 2C, 2C-1, and 2C-2, a conductive layer 230 is formed over the cap layer 210 and in the entire trenches 144, in accordance with some embodiments. In some embodiments, the conductive layer 230 has voids V. For the sake of simplicity, FIGS. 2C-1 and 2C-2 only show one of the voids V.

The conductive layer 230 is made of a conductive material, such as a metal material (e.g., cobalt, tungsten, ruthenium, aluminum, molybdenum, titanium, titanium nitride, titanium silicide, cobalt silicide, nickel silicide, copper, gold, silver, or a combination thereof), an alloy thereof, or a combination thereof, in accordance with some embodiments. The conductive layer 230 is formed using a physical vapor deposition process, a chemical vapor deposition process, a plating process, or another suitable process.

As shown in FIGS. 2D, 2D-1, and 2D-2, an annealing process is performed over the conductive layer 230, in accordance with some embodiments. After the annealing process, as shown in FIGS. 2C-1, 2C-2, 2D-1, and 2D-2, the voids V are removed, in accordance with some embodiments. Since the trenches 144 provide a large space in the direction parallel to the gate stacks G for accommodating the conductive layer 230, the voids V are small (as shown in FIGS. 2C-1 and 2C-2), in accordance with some embodiments. Therefore, the annealing process is able to remove the voids V completely, in accordance with some embodiments.

Afterwards, as shown in FIGS. 2D, 2D-1, and 2D-2, the conductive layer 230 outside of the trenches 144 is removed, in accordance with some embodiments. The conductive layer 230 remaining in the trenches 144 forms conductive strip structures 232, in accordance with some embodiments. The conductive strip structures 232 are over the stressors 150 and the isolation layer 120, in accordance with some embodiments.

The conductive strip structure 232 extends across the stressors 150, in accordance with some embodiments. The liner layer 220 is between the gate stack G and the conductive strip structure 232, in accordance with some embodiments. The removal process includes a chemical mechanical polishing (CMP) process, in accordance with some embodiments. Therefore, the top surfaces 212 and 232a of the cap layer 210 and the conductive strip structures 232 are coplanar, in accordance with some embodiments.

As shown in FIGS. 2E, 2E-1, and 2E-2, a mask layer 240 is formed over the conductive strip structures 232 and the cap layer 210 (or the gate stacks G), in accordance with some embodiments. The mask layer 240 has openings 242, in accordance with some embodiments. The openings 242 expose portions of the conductive strip structures 232, in accordance with some embodiments. The openings 242 expose portions of the cap layer 210, in accordance with some embodiments. The opening 242 is partially over the gate electrode 190 (or the gate stack G), in accordance with some embodiments.

The opening 242 is partially over the stressor 150, in accordance with some embodiments. The opening 242 is partially over the fin structure 114, in accordance with some embodiments. The mask layer 240 is made of a polymer material (e.g., a photoresist material), nitrides (e.g., silicon nitride), oxides (e.g., silicon dioxide), or another suitable material. The mask layer 240 is made of a material different from the materials of the cap layer 210 and the conductive strip structures 232, in accordance with some embodiments.

As shown in FIGS. 2E, 2F, 2F-1, and 2F-2, the portions of the of the conductive strip structures 232 exposed by the openings 242 are removed through the openings 242, in accordance with some embodiments. The removal process forms trenches 232t in the conductive strip structures 232, in accordance with some embodiments. The conductive strip structures 232 are divided into portions by the trenches 232t, and the portions form contact structures 232a, in accordance with some embodiments.

Each contact structure 232a is partially over the corresponding stressor 150, in accordance with some embodiments. The contact structure 232a is in direct contact with the stressor 150 thereunder, in accordance with some embodiments. The contact structure 232a extends across the stressor 150 thereunder, in accordance with some embodiments.

As shown in FIG. 2F-2, the contact structure 232a has a sidewall 232s, in accordance with some embodiments. In some embodiments, an angle θ1 between the sidewall 232s and a top surface 122 of the isolation layer 120 ranges from about 65° to about 89.5°. If the angle θ1 is less than 65, the top surface 232b may be too narrow, which may hinder connection between the top surface 232b and conductive vias subsequently formed thereon, in accordance with some embodiments. If the angle θ1 is greater than 89.5, the opening width of the trenches 232t may be too narrow, which may hinder the filling of the trenches 232t with a dielectric layer in a subsequent process, in accordance with some embodiments. The sidewall 232s is an inclined plane with respect to the top surface 122 (i.e., a horizontal reference plane), in accordance with some embodiments.

As shown in FIGS. 2F, 2F-1, and 2F-2, the mask layer 240 is removed, in accordance with some embodiments. As shown in FIG. 2F-2, the width W1 of the trench 232t decreases toward the substrate 110, in accordance with some embodiments. The width W1 continuously decreases from the opening of the trench 232t to the stressor 150 exposed by the trench 232t, in accordance with some embodiments.

As shown in FIG. 2F-2, the width W2 of the contact structure 232a increases toward the substrate 110, in accordance with some embodiments. The width W2 continuously increases from a top surface 232b of the contact structure 232a to the stressor 150 thereunder, in accordance with some embodiments.

As shown in FIGS. 2G, 2G-1, and 2G-2, a dielectric layer 250 is formed over the contact structures 232a, the cap layer 210, and the liner layer 220 and in the trenches 232t, in accordance with some embodiments. The dielectric layer 250 is made of a nitrogen containing material, such as silicon nitride (SiN), aluminum oxynitride (AlON), zirconium nitride (ZrN), tantalum carbonitride (TaCN), silicon oxycarbonitride (SiOCN), or silicon carbonitride (SiCN), in accordance with some embodiments.

In some other embodiments, the dielectric layer 250 is made of metal oxides, such as lanthanum oxide (LaO), aluminum oxide (AlO), zirconium oxide (ZrO), hafnium oxide (HfO), zinc oxide (ZnO), zirconium aluminum oxide (ZrAlO), titanium oxide (TiO), tantalum oxide (TaO), or yttrium oxide (YO), in accordance with some embodiments. In some embodiments, the dielectric layer 250 is made of a silicon containing material, such as silicon (Si), silicon carbide (SiC), zirconium silicide (ZrSi), hafnium silicide (HfSi), silicon oxycarbide (SiOC), or silicon oxide (SiO). As shown in FIG. 2G-1, a thickness T2 of the cap layer 210 over the spacers 140 ranges from about 1 nm to 50 nm, in accordance with some embodiments.

As shown in FIGS. 2H, 2H-1, and 2H-2, the dielectric layer 250 outside of the trenches 232t is removed, in accordance with some embodiments. In some embodiments, top portions of the cap layer 210 and the liner layer 220 are removed during removing the dielectric layer 250 outside of the trenches 232t. The dielectric layer 250 remaining in the trenches 232t forms dielectric structures 252, in accordance with some embodiments. The dielectric structure 252 is between two adjacent contact structures 232a, in accordance with some embodiments. The dielectric structure 252 is over the isolation layer 120, in accordance with some embodiments.

The dielectric structure 252 partially covers the stressor 150 and the fin structure 114, in accordance with some embodiments. The dielectric structure 252 and the adjacent contact structure 232a are in direct contact with the same stressor 150 therebetween, in accordance with some embodiments. The stressor 150 is embedded in the dielectric structure 252 and the adjacent contact structure 232a, in accordance with some embodiments. The dielectric structure 252 is in direct contact with the adjacent contact structure 232a, in accordance with some embodiments.

As shown in FIG. 2H-2, the width W3 of the dielectric structure 252 decreases toward the substrate 110, in accordance with some embodiments. The width W3 continuously decreases from the top surface 252a of the dielectric structure 252 to the stressor 150 thereunder, in accordance with some embodiments.

The formation of the contact structures 232a and the dielectric layer 250 includes forming the conductive strip structures 232 in the trenches 144 (as shown in FIGS. 2C-2D); partially removing the conductive strip structures 232 to form the trenches 232t dividing the conductive strip structures 232 into the contact structures 232a (as shown in FIG. 2F); and forming the dielectric layer 250 in the trenches 232t (as shown in FIGS. 2G-2H), in accordance with some embodiments.

According to the above descriptions, it is known that the contact structures 232a are formed before the formation of the dielectric layer 250. As a result, the formation of the contact structures 232a is not affected by the dielectric layer 250. Specifically, the conductive strip structures 232 are able to be smoothly filled into the trenches 144 without being blocked by the dielectric layer 250, in accordance with some embodiments. Therefore, the yield of the contact structures 232a (or the conductive strip structures 232) is improved by the sequence of the processes for forming the contact structures 232a and the dielectric layer 250, in accordance with some embodiments.

In some embodiments, the dielectric layers 160 and 250 are made of different materials. In some embodiments, the density of the dielectric layer 250 is greater than the density of the dielectric layer 160 (as shown in FIG. 1H). The dielectric layer 250 may have the electrical insulating ability higher than that of the dielectric layer 160. Therefore, the replacement of the dielectric layer 160 with the dielectric layer 250, which has higher electrical insulating ability, may decrease the distance between two adjacent contact structures 232a (i.e., the width W3 of the dielectric structure 252) or may increase time dependent dielectric breakdown (TDDB) lifetime.

As shown in FIG. 2H-2, the dielectric structure 252 has a sidewall 252s, in accordance with some embodiments. In some embodiments, an angle θ2 between the sidewall 252s and the top surface 122 of the isolation layer 120 ranges from about 90.5° to about 115°. The sidewall 252s is an inclined plane with respect to the top surface 122 (i.e., a horizontal reference plane), in accordance with some embodiments.

FIG. 2I-3 is a cross-sectional view illustrating the semiconductor device structure along a sectional line III-III' in FIG. 2I, in accordance with some embodiments. FIG. 2I-4 is a cross-sectional view illustrating the semiconductor device structure along a sectional line IV-IV' in FIG. 2I, in accordance with some embodiments. FIG. 2I-5 is a perspective view of the semiconductor device structure of FIG. 2I, in accordance with some embodiments.

As shown in FIGS. 2I, 2I-1, 2I-2, and 2I-3, upper portions of the contact structures 232a are removed, in accordance with some embodiments. After the removal process, recesses R2 are formed over the contact structures 232a, in accordance with some embodiments. Each recess R2 is surrounded by the liner layer 220 (or the cap layer 210), the contact structure 232a, and two adjacent dielectric structures 252, in accordance with some embodiments.

Thereafter, as shown in FIGS. 2I, 2I-1, 2I-2, and 2I-3, a cap layer 260 is formed in the recesses R2, in accordance with some embodiments. In this step, a semiconductor device structure 200 is substantially formed, in accordance with some embodiments. The cap layer 260 is formed using a deposition process and a planarization process, such as a chemical mechanical polishing process, in accordance with some embodiments. Therefore, as shown in FIG. 2I-1, the top surfaces 212, 222, 252a, and 262 of the cap layer 210, the liner layer 220, the dielectric structures 252, and the cap layer 260 are substantially coplanar, in accordance with some embodiments.

As shown in FIGS. 2I, 2I-1, 2I-2, and 2I-5, the dielectric structure 252 is between two adjacent contact structures 232a and between two adjacent gate stacks G, in accordance with some embodiments. The contact structure 232a is between two adjacent dielectric structures 252 and between two adjacent gate stacks G, in accordance with some embodiments. As shown in FIG. 2I-4, the gate stack G wraps around upper portions of the fin structures 114, in accordance with some embodiments.

As shown in FIG. 2I-2, a width W4 of the cap layer 260 increases toward the substrate 110, in accordance with some embodiments. The width W4 continuously increases from the top surface 262 of the cap layer 260 to the contact structure 232a, in accordance with some embodiments. The cap layer 260 is in direct contact with the contact structure 232a thereunder, two adjacent dielectric structures 252, and the liner layer 220, in accordance with some embodiments.

The cap layer 260 is made of a nitrogen containing material, such as silicon nitride (SiN), aluminum oxynitride (AlON), zirconium nitride (ZrN), tantalum carbonitride (TaCN), silicon oxycarbonitride (SiOCN), or silicon carbonitride (SiCN), in accordance with some embodiments.

In some other embodiments, the cap layer 260 is made of metal oxides, such as lanthanum oxide (LaO), aluminum oxide (AlO), zirconium oxide (ZrO), hafnium oxide (HfO), zinc oxide (ZnO), zirconium aluminum oxide (ZrAlO), titanium oxide (TiO), tantalum oxide (TaO), or yttrium oxide (YO), in accordance with some embodiments. In some embodiments, the cap layer 260 is made of a silicon containing material, such as silicon (Si), silicon carbide (SiC), zirconium silicide (ZrSi), hafnium silicide (HfSi), silicon oxycarbide (SiOC), or silicon oxide (SiO). The cap layers 210 and 260 are made of the same material, in accordance with some embodiments. In some other embodiments, the cap layer 260 is not formed.

As shown in FIGS. 2I-1 and 2I-2, the dielectric structure 252 is in direct contact with the cap layer 260, two adjacent contact structures 232a, the stressor 150 thereunder, the isolation layer 120, and the liner layer 220, in accordance with some embodiments. As shown in FIGS. 2I and 2I-1, the liner layer 220 is between the dielectric structure 252 (or the dielectric layer 250) and the gate stack G, in accordance with some embodiments. As shown in FIGS. 2I and 2I-1, the liner layer 220 is between the dielectric structure 252 and the cap layer 210, in accordance with some embodiments.

As shown in FIG. 2I-3, a thickness T3 of the cap layer 210 over the gate stack G ranges from about 1 nm to about 100 nm, in accordance with some embodiments. A (minimum) width W5 of the cap layer 210 adjacent to the gate stack G ranges from about 3 nm to about 50 nm, in accordance with some embodiments. The cap layer 210 has an upper portion 210a, in accordance with some embodiments. The upper portion 210a has a width W6 continuously decreasing toward the gate stack G, in accordance with some embodiments. The upper portion 210a has a thickness T4 ranging from about 1 nm to about 30 nm, in accordance with some embodiments. In some other embodiments, the upper portion 210a is previously removed during removing the dielectric layer 250 outside of the trenches 232t (i.e. the step of FIG. 2H).

As shown in FIG. 2I-3, the cap layer 260 has a thickness T5 ranging from about 1 nm to about 100 nm, in accordance with some embodiments. As shown in FIG. 2I-3, the cap layer 260 has a width W7 ranging from about 3 nm to about 30 nm, in accordance with some embodiments. As shown in FIG. 2I-1, the dielectric structure 252 has a thickness T6 ranging from about 1 nm to about 100 nm, in accordance with some embodiments.

FIG. 3 is a cross-sectional view illustrating a semiconductor device structure 300, in accordance with some embodiments. As shown in FIG. 3, the semiconductor device structure 300 is similar to the semiconductor device structure 200 of FIG. 2I-1, except that the cap layer 210 of the semiconductor device structure 300 further has a top portion 210t over the spacers 140, in accordance with some embodiments.

In accordance with some embodiments, semiconductor device structures and methods for forming the same are provided. The methods (for forming the semiconductor device structure) form contact structures adjacent to a gate stack before forming a dielectric layer adjacent to the gate stack. Therefore, the formation of the contact structures is not affected by the dielectric layer. As a result, the yield of the contact structures is improved by the sequence of the processes for forming the contact structures and the dielectric layer.

In accordance with some embodiments, a semiconductor device structure is provided. The semiconductor device structure includes a substrate and a first fin structure protruding from the substrate. The semiconductor device structure further includes an isolation layer formed around the first fin structure and covering a sidewall of the first fin structure and a gate stack formed over the first fin structure and the isolation layer. The semiconductor device structure further includes a first source/drain structure formed over the first fin structure and spaced apart from the gate stack and a contact structure formed over the first source/drain structure. The semiconductor device structure includes a dielectric structure formed through the contact structure. In addition, the contact structure and the dielectric structure has a first slope interface that slopes downwardly from a top surface of the contact structure to a top surface of the isolation layer.

In accordance with some embodiments, a semiconductor device structure is provided. The semiconductor device structure includes a substrate and a fin structure protruding from the substrate and having a first longitudinal axis along a first direction. The semiconductor device structure includes a gate stack formed across the fin structure along a second direction different from the first direction and a source/drain structure attached to the fin structure. The semiconductor device structure includes a contact structure formed over the source/drain structure and having a second longitudinal axis along the second direction and a dielectric structure formed through the contact structure and having a top surface and a bottom surface. In addition, the dielectric structure has a first dimension at the top surface along the second direction and a second dimension at the bottom surface along the second direction, and the first dimension is greater than the second dimension, and the bottom surface of the dielectric structure is no lower than a bottom surface of the contact structure.

In accordance with some embodiments, a semiconductor device structure is provided. The semiconductor device structure includes a fin structure protruding from a substrate and extending along a first direction and a gate stack formed over the substrate and extending along a second direction different from the first direction. The semiconductor device structure further includes a dielectric structure spaced apart from the gate stack along the second direction, and the dielectric structure has a slope sidewall. The semiconductor device structure further includes source/drain structures formed at opposite sides of the gate stack along the first direction and a contact structure formed over the source/drain structures and covering a lower portion of the slope sidewall of the dielectric structure. The semiconductor device structure further includes a first cap layer vertically overlapping the contact structure and covering an upper portion of the slope sidewall of the dielectric structure.

In accordance with some embodiments, a method for forming a semiconductor device structure is provided. The method includes forming a first source/drain structure and a second source/drain structure in a substrate. The method includes forming a first dielectric layer over the first source/drain structure, the second source/drain structure, and the substrate. The first dielectric layer has a first trench between the first source/drain structure and the second source/drain structure. The method includes forming a gate electrode in the first trench. The method includes removing the first dielectric layer. The method includes forming a first conductive strip structure over the first source/drain structure and the substrate. The method includes partially removing the first conductive strip structure to form a second trench in the first conductive strip structure. The first conductive strip structure is divided into a first portion and a second portion by the second trench, the first portion and the second portion are respectively over the first source/drain structure and the substrate, and the first portion forms a contact structure. The method includes forming a second dielectric layer in the second trench.

In accordance with some embodiments, a method for forming a semiconductor device structure is provided. The method includes providing a substrate having a base structure and a fin structure over the base structure. The method includes forming a first source/drain structure and a second source/drain structure in the fin structure. The method includes forming a first dielectric layer over the first source/drain structure, the second source/drain structure, and the substrate. The first dielectric layer has a first trench between the first source/drain structure and the second source/drain structure. The method includes forming a gate electrode in the first trench. The gate electrode wraps around the fin structure. The method includes removing the first dielectric layer. The method includes forming a first conductive strip structure over the first source/drain structure and the base structure. The method includes partially removing the first conductive strip structure to form a second trench in the first conductive strip structure. The first conductive strip structure is divided into a first portion and a second portion by the second trench, the first portion and the second portion are respectively over the first source/drain structure and the base structure, and the first portion forms a contact structure. The method includes forming a second dielectric layer in the second trench.

In accordance with some embodiments, a semiconductor device structure is provided. The semiconductor device structure includes a substrate. The semiconductor device structure includes a gate electrode over the substrate. The semiconductor device structure includes a first source/drain structure and a second source/drain structure in the substrate and over opposite sides of the gate electrode. The semiconductor device structure includes a contact structure over the first source/drain structure, and a first width of the contact structure increases toward the substrate. The semiconductor device structure includes a first dielectric structure adjacent to the contact structure and the gate electrode, and a second width of the first dielectric structure decreases toward the substrate.

In accordance with some embodiments, a semiconductor device structure is provided. The semiconductor device structure includes a substrate and a first fin structure protruding from the substrate. The semiconductor device structure further includes a gate stack formed across the first fin structure and a first source/drain structure formed over the first fin structure adjacent to the gate stack. The semiconductor device structure further includes a contact structure formed over the first source/drain structure and a dielectric structure formed through the contact structure. In addition, a bottom surface of the contact structure is wider than a top surface of the contact structure.

In accordance with some embodiments, a semiconductor device structure is provided. The semiconductor device structure includes a substrate and a fin structure protruding from the substrate. The semiconductor device structure includes a gate stack formed across the fin structure and a spacer formed over a sidewall of the gate stack. The semiconductor device structure further includes a source/drain structure formed over the fin structure adjacent to the gate stack and a liner layer formed covering a sidewall of the spacer over the source/drain structure. The semiconductor device structure includes a contact structure formed over the source/drain structure and a dielectric structure formed through the contact structure and partially covering the source/drain structure. In addition, the contact structure is in direct contact with the dielectric structure.

In some embodiments, a semiconductor device structure is provided. The semiconductor device structure includes a substrate and a gate stack formed over the substrate. The semiconductor device structure further includes a source/drain structure formed adjacent to the gate stack and a contact structure vertically overlapping the source/drain structure. In addition, the contact structure has a first sidewall slopes downwardly from its top surface to its bottom surface, and an angle between the first sidewall and a bottom surface of the contact structure is smaller than 89.5°.

In some embodiments, a semiconductor device structure is provided. The semiconductor device structure includes a gate stack longitudinally oriented along a first direction and a first source/drain structure and a second source/drain structure formed at a first side and a second side of the gate stack respectively. In addition, the first source/drain structure is substantially aligned with the second source/drain structure in a second direction. The semiconductor device structure further includes a contact structure formed over the first source/drain structure and a dielectric structure attached to the contact structure in the first direction. In addition, a top portion of the dielectric structure is wider than a middle portion of the dielectric structure in a cross-sectional view along the first direction.

In some embodiments, a method for forming a semiconductor device structure is provided. The method includes forming a first source/drain structure over a substrate and forming a gate stack adjacent to the first source/drain structure. The method includes forming a conductive strip structure over the first source/drain structure and forming a trench through the conductive strip structure to divide the conductive strip structure into a first portion and a second portion. In addition, the first portion of the conductive strip structure at least partially covers the first source/drain structure. The method includes forming a dielectric structure in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a gate stack formed over the substrate;
   a source/drain structure formed adjacent to the gate stack; and
   a contact structure vertically overlapping the source/drain structure, wherein the contact structure has a first sidewall slopes downwardly from its top surface to its bottom surface, and an angle between the first sidewall and a bottom surface of the contact structure is smaller than 89.5°.

2. The semiconductor device structure as claimed in claim 1, wherein the contact structure has a second sidewall slopes downwardly from its top surface to a top surface of the source/drain structure.

3. The semiconductor device structure as claimed in claim 2, further comprising:
   a first dielectric structure covering the first sidewall of the source/drain structure; and
   a second dielectric structure covering the second sidewall of the source/drain structure,
   wherein a first sidewall of the first dielectric structure, a first sidewall of the second dielectric structure, and a third sidewall of the contact structure substantially aligned with each other in a top view.

4. The semiconductor device structure as claimed in claim 3, wherein the first sidewall and the second sidewall of the contact structure connect to opposite sides of the third sidewall of the contact structure.

5. The semiconductor device structure as claimed in claim 3, further comprising:
   a liner layer in contact with the first sidewall of the first dielectric structure, the first sidewall of the second dielectric structure, and the third sidewall of the contact structure.

6. The semiconductor device structure as claimed in claim 5, wherein the liner layer is laterally sandwiched between the contact structure and the gate stack and is in direct contact with the top surface of the source/drain structure.

7. The semiconductor device structure as claimed in claim 1, further comprising:
   a first cap layer formed over the gate stack; and
   a second cap layer formed over the contact structure,
   wherein an interface between the first cap layer and the gate stack is lower than an interface between the second cap layer and the contact structure.

8. A semiconductor device structure, comprising:
   a gate stack longitudinally oriented along a first direction;
   a first source/drain structure and a second source/drain structure formed at a first side and a second side of the gate stack respectively, wherein the first source/drain structure is substantially aligned with the second source/drain structure in a second direction;
   a third source/drain structure formed at the first side of the gate stack and spaced apart from the first source/drain structure in the first direction;
   a contact structure formed over the first source/drain structure, wherein both the first source/drain structure and the third source/drain structure are connected to the contact structure; and
   a dielectric structure attached to the contact structure in the first direction, wherein a top portion of the dielectric structure is wider than a middle portion of the dielectric structure in a cross-sectional view along the first direction.

9. The semiconductor device structure as claimed in claim 8, wherein the contact structure laterally protruding from opposite edges of the third source/drain structure in the first direction.

10. The semiconductor device structure as claimed in claim 8, further comprising:
a liner layer longitudinally oriented along the first direction and laterally sandwiched between the contact structure and the gate stack along the second direction, wherein a dimension of the liner layer is greater than a dimension of the contact structure in the first direction.

11. The semiconductor device structure as claimed in claim 10, wherein the dimension of the liner layer is greater than a sum of the dimension of the contact structure and a dimension of the dielectric structure in the first direction.

12. The semiconductor device structure as claimed in claim 8, further comprising:
a first cap layer formed over the contact structure; and
a second cap layer formed over the gate stack,
wherein a width of the first cap layer is substantially equal to a width of the second cap layer in the second direction.

13. A semiconductor device structure, comprising:
a first semiconductor structure;
a gate stack formed over the first semiconductor structure;
gate spacers on sidewalls of the gate stack;
an isolation layer under the gate stack;
a first source/drain structure attached to the first semiconductor structure and adjacent to the gate stack;
a contact structure formed over the first source/drain structure;
a cap layer formed over the contact structure, wherein a top width of the cap layer is greater than a bottom width of the cap layer; and
a dielectric structure extending downwardly from a first sidewall of the cap layer to a second sidewall of the contact structure.

14. The semiconductor device structure as claimed in claim 13, wherein a top surface of the dielectric structure is substantially level with a top surface of the cap layer, and a bottom surface of the dielectric structure is substantially level with a bottom surface of the contact structure.

15. The semiconductor device structure as claimed in claim 13, wherein the first sidewall of the cap layer and the second sidewall of the contact structure have substantially a same slope.

16. The semiconductor device structure as claimed in claim 13, further comprising:
a second semiconductor structure at a first side of the first semiconductor structure; and
a second source/drain structure attached to the second semiconductor structure and at the first side of the first source/drain structure,
wherein the contact structure has a third sidewall at the first side of the second source/drain structure and the second sidewall over the first source/drain structure.

17. The semiconductor device structure as claimed in claim 13, wherein the contact structure is in contact with a top surface of the isolation layer.

18. The semiconductor device structure as claimed in claim 13, wherein a bottom surface of the contact structure is lower than a bottom surface of the first source/drain structure.

19. The semiconductor device structure as claimed in claim 13, further comprising:
a gate cap layer over the gate stack, wherein a vertical dimension of the gate cap layer is greater than a vertical dimension of the cap layer.

20. The semiconductor device structure as claimed in claim 8, wherein a portion of the contact structure is sandwiched between the first source/drain structure and the third source/drain structure.

* * * * *